United States Patent
Kubota et al.

[11] Patent Number: 6,157,361
[45] Date of Patent: Dec. 5, 2000

[54] MATRIX-TYPE IMAGE DISPLAY DEVICE

[75] Inventors: Yasushi Kubota, Sakurai; Ichiro Shiraki; Tamotsu Sakai, both of Tenri, all of Japan

[73] Assignee: Sharp Kabushiki Kaisha, Osaka, Japan

[21] Appl. No.: 08/892,157

[22] Filed: Jul. 14, 1997

[30] Foreign Application Priority Data

Jul. 22, 1996 [JP] Japan .................................. 8-192566
Jul. 7, 1997 [JP] Japan .................................. 9-181546

[51] Int. Cl.$^7$ .................................................. G09G 3/36
[52] U.S. Cl. .............................. 345/100; 345/90; 345/92; 327/333; 326/81
[58] Field of Search ............................ 345/90, 92, 87, 345/98, 211, 204, 100; 327/333; 326/81

[56] References Cited

U.S. PATENT DOCUMENTS

| 5,467,043 | 11/1995 | Ohi | 327/333 |
| 5,510,748 | 4/1996 | Erhart et al. | 327/530 |
| 5,723,986 | 3/1998 | Nakashiro et al. | 326/81 |
| 5,726,676 | 3/1998 | Callahan, Jr. et al. | 345/98 |
| 5,731,796 | 3/1998 | Furuhashi et al. | 345/96 |
| 5,867,138 | 2/1999 | Moon | 345/92 |
| 5,949,398 | 9/1999 | Kim | 345/100 |
| 5,959,603 | 9/1999 | Ito et al. | 345/100 |

FOREIGN PATENT DOCUMENTS 06095073A 4/1994 Japan.
07168153A 7/1995 Japan.

*Primary Examiner*—Dennis-Doon Chow
*Assistant Examiner*—Amr Awad
*Attorney, Agent, or Firm*—Nixon & Vanderhye P.C.

[57] ABSTRACT

A matrix-type image display device of the present invention is arranged such that image data are selectively applied to pixels arranged in a matrix form through scanning signal lines and data signal lines, and the image data are stored therein, wherein a high potential of a sampling pulse 0V/5V to be output from a logic circuit is shifted to 10 V, and a low potential thereof is shifted to −8 V respectively by first and second level shifters. As a result, a difference between an input signal level from an external circuit such as a control circuit, an image signal processing circuit, etc., and an actual driving signal level of each pixel can be absorbed. Therefore, an additional structure such as an interface circuit, etc., is not needed between the external circuit and the scanning signal line driving circuit, thereby enabling a low cost and a low power consumption.

21 Claims, 13 Drawing Sheets

MATRIX-TYPE IMAGE DISPLAY DEVICE

FIELD OF THE INVENTION

The present invention relates to a matrix-type image display device wherein pixels are arranged in a matrix form on a substrate, and particularly relates to improvements of a driving circuit for display driving each pixel in such matrix-type image display device.

BACKGROUND OF THE INVENTION

Conventionally, image display devices wherein a liquid crystal element, an EL (electro luminescent) element, and an LED (light emitting diode) element, etc., are arranged in a matrix form has been used. Such a matrix-type image display device will be explained below through an example of a liquid crystal display device.

FIG. 11 is a front view showing a schematic structure of a generally used liquid crystal display device 1. As shown in FIG. 11, the liquid crystal display device 1 is mainly composed of a pixel array ARY, a scanning signal line driving circuit gd, a data signal line driving circuit sd and a control circuit 2.

On the pixel array ARY, a plurality of pixels PIX are formed. The scanning signal line driving circuit sd and the data signal line driving circuit sd are provided for display driving the pixels PIX. The control circuit 2 is provided for controlling the driving of these signal line driving circuits gd and sd.

On the pixel array ARY, a plurality of scanning signal lines $GL_j$ (j=1, 2, . . . , n) and a plurality of data signal lines $SL_i$ (i=1, 2, . . . , m) are formed so as to cross at a right angle. Then, in a region surrounded by the adjoining two scanning signal lines $GL_j$ and $GL_{j+1}$ and two data signal lines $SL_j$ and $SL_{j+1}$, the pixel PIX is formed. As described, the pixels PIX are formed in a matrix form on the pixel array ARY.

The data signal line driving circuit sd samples and if necessary amplifies the image signal DAT as input, and outputs it to each data signal line $SL_i$. This sampling is carried out in sync with the timing signal such as a clock signal CKS, etc., from the control circuit 2. The scanning signal line driving circuit gd sequentially selects the scanning signal lines $GL_j$ and controls the opening/closing of the switching element (to be described later) provided in the pixel PIX. This control is performed in sync with the timing signal such as a clock signal CKG, GPS, etc., from the control circuit 2.

By the described operations of the circuits sd and gd, the image signal (data) DAT is output to the data signal line $SL_i$ to be written in each pixel PIX. Then, until the next scanning timing, the image data DAT is held in each pixel PIX to carry out a display output.

As a system of outputting an image data DAT to each data signal line $SL_i$ by the data signal line driving circuit sd, a dot sequential driving system and a line sequential driving system have been known. In the dot sequential driving system, the image data DAT are sequentially output to a pixel of a line selected by the scanning signal line $GL_j$. In the line sequential driving system, image data DAT are output to pixels on the line as selected at once. An example of the data signal line driving circuit of the dot sequential driving system of a simple circuit structure will be explained with reference to FIG. 12.

FIG. 12 is a block diagram showing an electric structure of a data signal line driving circuit sd of the dot sequential driving system as a typical conventional example. As shown in the figure, an analog switch $asw_i$ is formed along each data signal line $SL_i$. When the analog switch $asw_i$ conducts, the image data DAT is sampled to be output to each data signal line $SL_i$. In order to control these analog switches $asw_i$, scanning circuits $srs_i$ (i=1, 2, . . . , m) and buffers $bufs_i$ respectively corresponding to analog switches $asw_i$ are formed.

The scanning circuits $srs_i$ are mutually cascade-connected. To each scanning circuit $srs_i$, a common clock signal CKS is input. To the leading end of the scanning circuit $srs_1$, a start pulse SPS prepared based on a horizontal scanning signal is applied.

When the start pulse SPS is applied to the scanning circuit $srs_1$, a sampling pulse is output from each scanning circuit $srs_i$. The output of the sampling pulse in each scanning circuit $srs_i$ is sequentially carried out from the scanning circuit $srs_1$ of the starting end. The sampling pulse is held and amplified in the buffer $bufs_i$, and inverses when necessary to be applied to each analog switch $asw_i$.

The scanning signal line driving circuit gd shown in FIG. 11, for example, has a structure of FIG. 13. As shown in the figure, the scanning signal line driving circuit gd includes scanning circuits $srg_k$ (K=1, 2, . . . , n+1) having the same arrangement as the aforementioned scanning circuit $srs_i$, and two kinds of AND circuits $and1_j$ and $and2_j$, and a buffer $bufg_j$ respectively corresponding to the scanning signal lines $GL_j$.

Each scanning circuit $srg_k$ is cascade-connected to the scanning circuit $srs_i$. Upon inputting the start pulse SPG prepared based on a vertical sync signal to the leading end scanning circuit $srg_1$, the start pulse SPG responds to the clock signal CKG prepared based on the horizontal scanning signal. The start pulses SPG are sequentially output to the scanning circuits $srg_2$, $srg_3$, . . . in the post stage.

The respective outputs from the adjoining scanning circuits $srg_j$ and $srg_{j+1}$ are computed in an AND circuit $and1_j$. Thereafter, the output from the AND circuit $and1_j$ is computed with the clock signal GPS in the AND circuit $and2_j$ to be input respectively to the buffer $bufg_j$.

In response to the clock signal CKG, each scanning circuit $srg_k$ outputs the start pulse SPG with a lag of a half period from the $srg_{k-1}$ in the post stage. Namely, the pulse to be output from the scanning circuit $srg_j$ rises at a timing of a rise of the clock signal CKG and is held for one period until the next rise timing. In contrast, the scanning circuit $srg_{j+1}$ in the next stage outputs a pulse for one period from a timing of a fall of the clock signal CKG. Namely, the pulse having a time difference of a half period between the adjoining scanning circuits $srg_j$ and $srg_{j+1}$ is input to the AND circuit $and1_j$. Therefore, from the AND circuit $and1_j$, the pulse of a length of a ½ period of the clock signal CKG is output to the AND circuit $and2_j$.

The speed of the clock signal GPS is, for example, twice as high as that of the clock signal CKG. Therefore, the pulse to be output from the AND circuit $and2_j$ is shorter than a ½ period of the clock signal CKG, thereby preventing a generation of a period in which pulses are overlapped between the adjoining AND circuits $and2_j$ and $and2_{j+1}$. The output from the AND circuit $and2_j$ is amplified in the buffer $bufg_j$ and inverses if necessary to be output to each scanning signal line $GL_j$.

Here, respective driving voltages for the signal line driving circuits gd and sd will be considered. The driving voltage for the data signal line driving circuit sd is selected to satisfy the conditions of: (a) the scanning circuit $srs_i$ can be driven at a frequency as desired, and (b) the image data DAT of both positive and negative polarities can be output to the data signal line $SL_i$. Specifically, the desirable frequency is around 25.2 MHz in the case of the VGA (Video Graphical Array) display in the case where the scanning signal line driving circuits gd are not aligned in parallel or the sampling is not carried out simultaneously. In general, the driving voltage is determined based on a request from the analog switch $asw_i$ rather than a request from the scanning circuit $srs_i$.

For example, when the liquid crystal driving voltage is ±5V, and the voltage of the counter electrode is 0 V, the level of the image signal at the data signal line $SL_i$ is in a range of from −5 to +5V, and the driving voltage of the data signal line driving circuit sd is in a range of from −5 to +5 V.

In contrast, in the scanning signal line driving circuit gd, the driving voltage on the positive polarity side is determined such that the switching element in the pixel PIX writes the image data of positive polarity to the pixel capacitor. Additionally, the driving voltage of the negative polarity side is determined such that the image data having a negative polarity can be held for 1 frame period.

For example, when a threshold voltage of the switching element is +3V, the driving signal level of the scanning signal line driving circuit gd is determined as follows. Namely, on the side of the positive polarity, the voltage becomes around 10 V obtained by adding the level +5V of the image signal and the margin +2V to +3V. On the other hand, on the negative polarity side, the voltage becomes around −8V obtained by adding the image data DAT level −5V and the margin −6V to +3V. Here, the driving signal level suggests respective output signal levels of the signal line driving circuits gd and sd, which may be equivalent to the respective driving voltages for these signal line driving circuits gd and sd.

Each of the described driving signal levels and driving voltages show merely examples, and an optimal value for each driving voltage varies depending on factors such as the driving method, the arrangement of the driving circuit, characteristics of the transistor, the kind of the liquid crystals, etc.

As described, in the liquid crystal display device, the liquid crystals are display driven as described above. In general, the driving voltage of the data signal line driving circuit sd and the driving voltage of the scanning signal line driving circuit gd are at mutually different levels, and are larger than the voltage that is generally used in an integration circuit, that is, for example, 3.3 V or 5 V.

This is because it is required to apply respective voltages of around 5V as a driving voltage of the signal line driving circuits sd and gd. Another cause is a difference in structure between the data signal line driving circuit sd and the scanning signal line driving circuit gd. Namely, the analog switch $asw_i$ of the data signal line driving circuit sd has a CMOS structure for handling the image data DAT of both positive and negative polarities, while the switching element in the pixel PIX controlled by the scanning signal line driving circuit sd has a single channel structure such as NMOS, etc.

In order to obtain the described driving signal, it is required to set the respective amplitudes of the clock signals CKS, CKG, GPS, etc., and the start pulses SPS, SPG, etc., to be input to these signal line driving circuits sd and gd large and to have a level as desired. In order to obtain these clock signals CKS, CKG, GPS and the start pulses SPS, SPG, etc., it is required to increase the cost and the power consumption. This is because the control circuit 2, the interface circuit, etc., are required. The control circuit 2 is provided for controlling these signal line driving circuits sd and gd. The interface circuit is provided for shifting the output from the external circuit such as the image signal processing circuit, etc., to the voltage level as desired.

Another solution to the described conventional technique is disclosed in, for example, Japanese Unexamined Patent Publication No. 95073/1994 (Tokukaihei 6-95073). In this technique, the respective input amplitudes of the data signal line driving circuit and the scanning signal line driving circuit are adjusted to 5 V (0 V–5 V). Further, by the level shift circuit formed inside the driving circuit, it is boosted to 15 V (0V–15V), i.e., the output amplitude level as desired. By controlling the input signal in the described manner, the amplitude of the input signal is made small, and the load of the external interface circuit can be made small.

However, in the conventional techniques, the voltage level of one input signal (only the high potential side in this example) is level shifted, and the respective input signal levels of the data signal line driving circuit and the scanning signal line driving circuit are boosted to the driving signal level of the same level.

Therefore, in the described case where respective optimal values of the driving signal levels for the data signal line driving circuit and the scanning signal line driving circuit differ, the described conventional technique may not be applied.

SUMMARY OF THE INVENTION

It is therefore an object of the present invention to provide a matrix-type image display device which permits a simplified structure by setting the respective input signal levels of data signal line driving circuits and scanning signal line driving circuits at the same and low level even when adopting optimal driving voltages for the data signal line driving circuit and the scanning signal line driving circuit, and also permits a low power consumption.

In order to accomplish the described object, the matrix-type image display device of the present invention includes a substrate in which pixels having switching elements are arranged in a matrix form in a region segmented by scanning signal lines and data signal lines, a scanning signal line driving circuit for driving the scanning signal line, a data signal line driving circuit for driving the data signal line, and first and second level shift circuits for shifting the voltage level of the driving signal, the first and second level shift circuits being provided in at least one of the scanning signal line driving circuit and the data signal line driving circuit.

According to the described arrangement, even if a low voltage is input from an external circuit such as a control circuit, an image signal processing circuit having an amplitude of, for example, 5V, the signal line driving circuit can shift respective voltage levels of the output signals at both the low potential side and the high potential side by the first and second level shift circuits provided in the output stage.

Therefore, a simplified structure and a lower power consumption can be achieved by reducing the load of the external circuit, and an optimal driving signal level applicable to the driving circuit structure and the display medium, etc., can be obtained, thereby improving a display quality.

For a fuller understanding of the nature and advantages of the invention, reference should be made to the ensuing detailed description taken in conjunction with the accompanying drawings.

BRIEF DESCRIPTION OF THE DRAWINGS

FIG. 2(a) is a waveform diagram showing a clock signal to be input in common in a scanning circuit;

FIG. 2(b) is a waveform diagram showing a start pulse to be input in common in a leading end of the scanning circuit;

FIG. 2(c) is a waveform diagram showing an example of a clock signal to be input to a logic circuit from a control circuit;

FIG. 2(d) is a waveform diagram showing an output from a logic circuit;

FIG. 2(e) is a waveform diagram showing an output from the first level shifter;

FIG. 2(f) is a waveform diagram showing an output from the second level shifter;

FIG. 2(g) is a waveform diagram showing a voltage level of the scanning signal line;

FIG. 5(a) through FIG. 5(f) are cross-sectional views schematically showing the element structure which enables the level shifter shown in FIG. 4, wherein FIG. 5(a) is a cross-sectional view showing a transistor having a structure called "single drain structure" which constitutes the scanning circuit and the logical circuit, FIG. 5(b) is a cross-sectional view showing the transistor having a high withstanding voltage and a long channel for use in a level shifter, a buffer and a sampling circuit, FIG. 5(c) is a cross-sectional view showing a transistor having a thick gate insulting film, FIG. 5(d) is a cross-sectional view showing a transistor having a structure called "LDD structure", FIG. 5(e) is a cross-sectional view showing a transistor called "offset structure", and FIG. 5(f) is a cross-sectional view showing a transistor called "multi-gate structure";

FIG. 10(a) through FIG. 10(g) are waveform diagrams explaining respective operations of the scanning signal line driving circuit in the liquid crystal display device of FIG. 8, wherein FIG. 10(a) is a waveform diagram of a clock pulse to be input in common in the scanning circuit, FIG. 10(b) is a waveform diagram of a start pulse to be input to a leading end of the scanning circuit, FIG. 10(c) is a waveform diagram showing an example of a clock signal to be input to the logical circuit from the control circuit, FIG. 10(d) is a waveform diagram showing an output from the logical circuit, FIG. 10(e) is a waveform diagram showing an output from the first level shifter, FIG. 10(f) is a waveform diagram showing an output from the second level shifter, and FIG. 10(g) is a waveform diagram showing a voltage level of the scanning signal line;

DESCRIPTION OF THE EMBODIMENTS

[FIRST EMBODIMENT]

The following descriptions will discuss one embodiment of the present invention.

Figure 1:
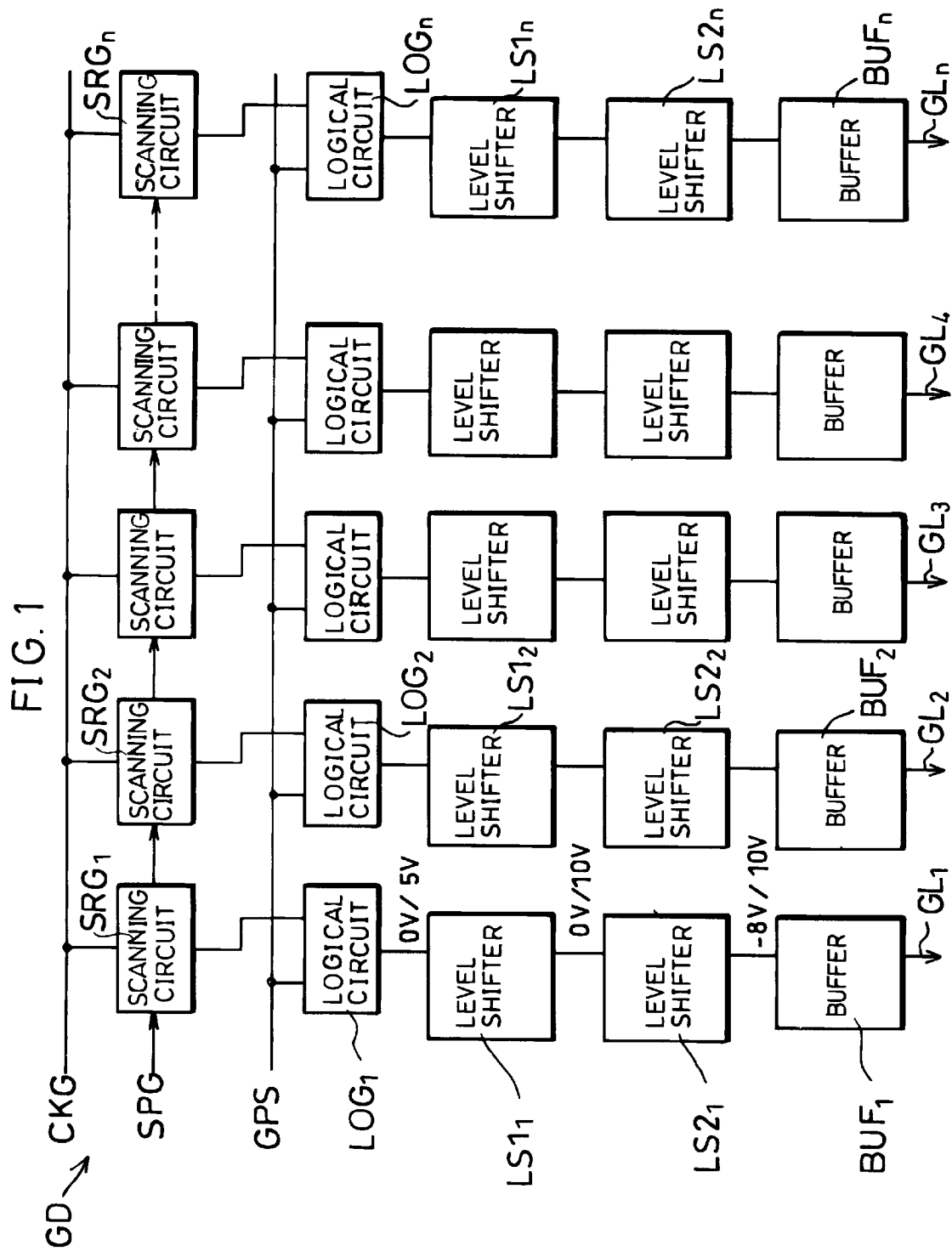
FIG. 1 is a block diagram showing an electric structure of a scanning signal line driving circuit in accordance with one embodiment of the present invention.
Figure 2:
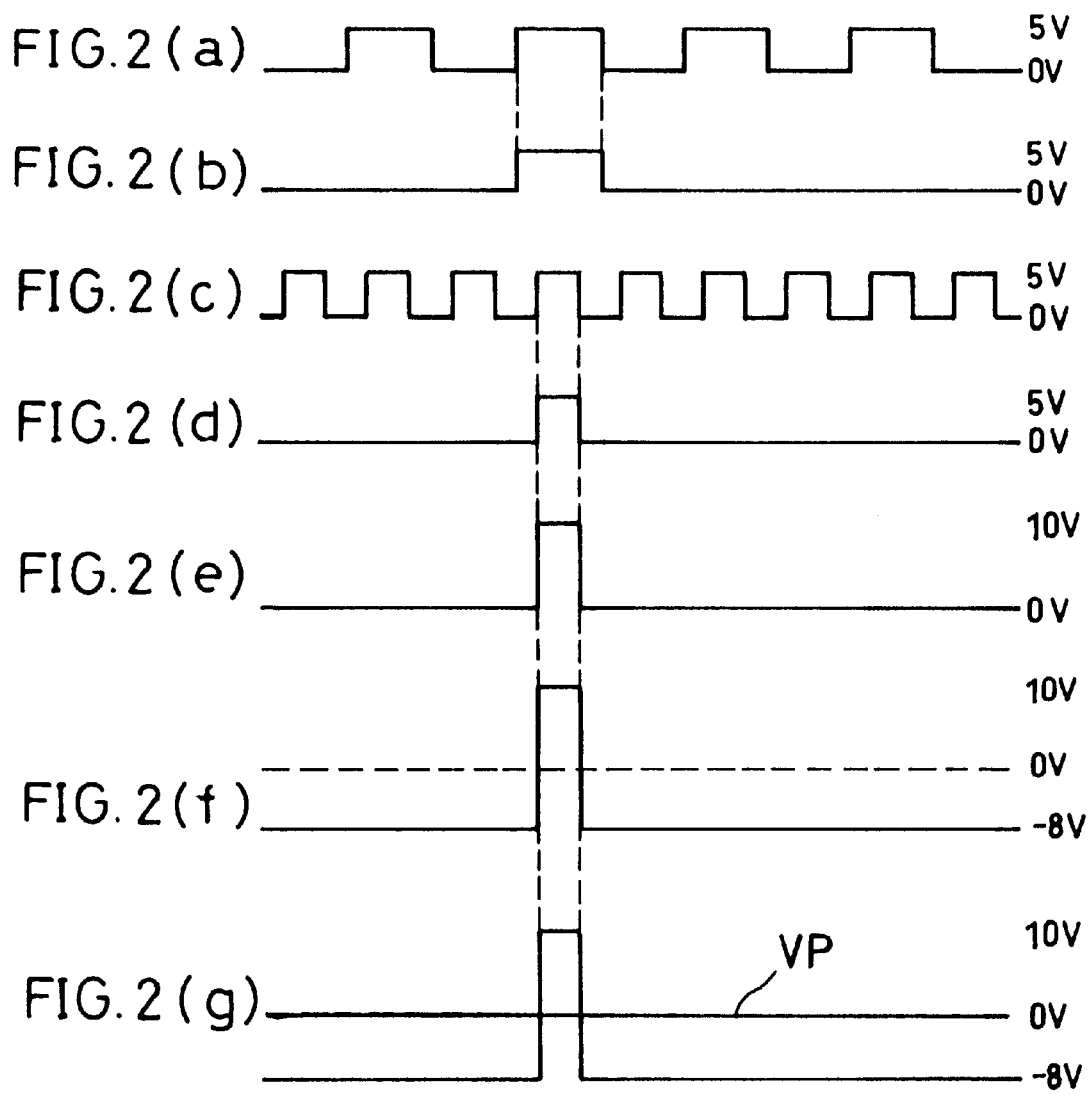
FIG. 2(a) through FIG. 2(g) are waveform diagrams explaining an operation of a scanning signal line driving circuit shown in FIG. 1.
Figure 3:
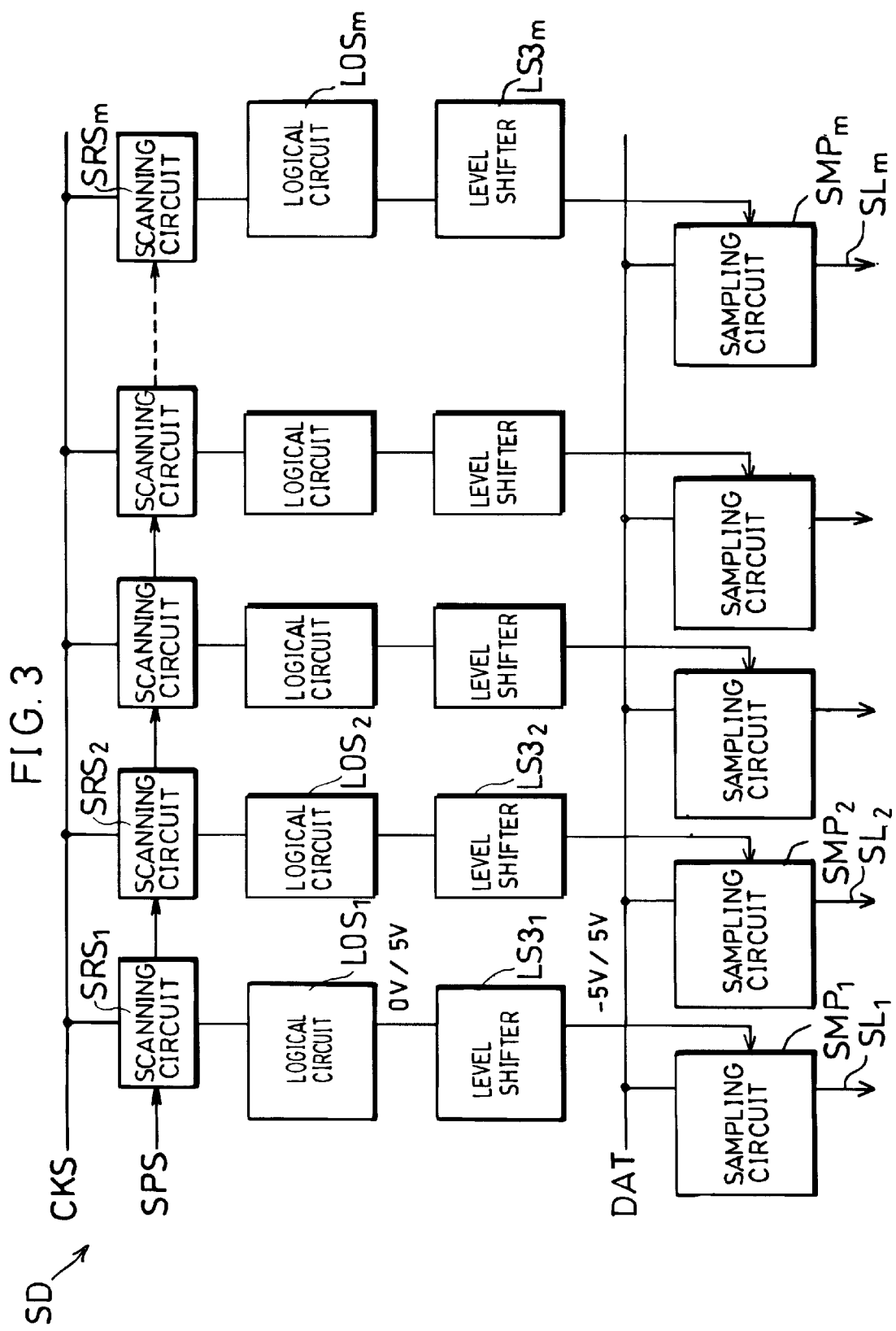
FIG. 3 is a block diagram showing an electric structure of a data signal line driving circuit in accordance with one embodiment of the present invention.

FIG. 1 is a block diagram showing an electric structure of a scanning signal line driving circuit GD in accordance with one embodiment of the present invention. FIG. 2(a) through FIG. 2(g) are waveform diagrams explaining an operation of a scanning signal line driving circuit shown in FIG. 1. FIG. 3 is a block diagram showing an electric structure of the data signal line driving circuit SD in accordance with the present embodiment. These signal line driving circuits GD and SD may be used in place of the conventional signal line driving circuits gd and sd adopted in the generally used liquid crystal display device 1.

As shown in FIG. 1, the scanning signal line driving circuit GD includes scanning circuits $SRG_j$ (j=1, 2, . . . , n), logic circuits $LOG_j$, level shifters (first level shifter) $LS1_j$, level shifters (second level shifter) $LS2_j$, and buffers $BUF_j$ which are formed so as to correspond to scanning signal lines $GL_j$ respectively. Each scanning circuit $SRG_j$ is formed, for example, by a shift register, and respective scanning circuits $SRG_j$ are cascade-connected.

To these scanning circuits $SRG_j$, a clock signal CKG as shown in FIG. 2(a) is input in common. The clock signal CKG is prepared based on a horizontal synchronous signal, etc., and is input to these scanning circuits $SRG_j$ from the control circuit 2.

To the leading end of the scanning circuit $SRG_1$, the start pulse SPG shown in FIG. 2(b) is input. The start pulse SPG is prepared based on the vertical synchronous signal, etc., and is input to the scanning circuit $SRG_1$ from the control circuit 2. To the other scanning circuits $SRG_2$ through $SRG_n$, an output from the scanning circuits $SRG_1$ through $SRG_{n-1}$ in the pre-stage is sent. Therefore, the start pulse SPG is transferred to the scanning circuit in the post-stage in order in response to the clock signal CKG. Additionally, the output from each scanning circuit $SRG_j$ is input to the corresponding logic circuit $LOG_j$. Additionally, to these logic circuits $LOG_j$, the clock signal GPS is input from the control circuit 2. The clock signal GPS is a signal having a frequency of, for example, two times as high as the clock signal CKG shown in FIG. 2(c).

FIG. 2(d) is a waveform diagram showing an output from the logical circuit $LOG_j$, and an output of high level is derived only in a period when the respective outputs from the scanning circuit $SRG_j$ and the clock signal GPS are both in the high level. Therefore, an output from the logical circuit $LOG_j$ becomes high level only in a ¼ period of the clock signal CKG. Additionally, between the adjoining logical circuits $LOG_{j-1}$ and $LOG_{j+1}$, high level periods are not overlapped.

As in the case of the control circuit 2 or the image signal processing circuit (not shown), in the scanning circuit $SRG_j$ and the logical circuit $LOG_j$, the driving voltage is set to 5 V. Therefore, the output voltage level from the logical circuit $LOG_j$ is 0V/5V. The voltage level of the output from the logical circuit $LOG_j$ is shifted to 0V/10V in the first level shifter $LS1_j$ as shown in FIG. 2(e). Thereafter, as shown in FIG. 2(f), the output is further shifted to −8V/10V in the second level shifter $LS2_j$. Then, an output from the level shifter $LS2_j$ is amplified by the buffer $BUF_j$, and inverted when necessary, and is output to each scanning signal line $GL_j$. The voltage level of the scanning signal line $GL_j$ is as shown in FIG. 2(g).

Additionally, as shown in FIG. 3, the data signal line driving circuit SD includes a scanning circuit $SRS_i$ (i=1, 2, ..., m), a logical circuit $LOS_i$, a level shifter (third level shifter) $LS3_i$, and a sampling circuit $SMP_i$. The scanning circuit $SRS_i$ is separately provided for each data signal line $SL_i$. Additionally, the scanning circuits $SRS_i$ are cascade-connected in a similar manner to the scanning circuit $SRG_j$. To these scanning circuits $SRS_i$, the clock signal CKS is input from the control circuit 2. To the leading end of the scanning circuit $SRS_1$, a start pulse SPS is input. The start pulse SPS is prepared based on the horizontal synchronous signal, etc. To the other scanning circuits $SRS_2$ through $SRS_m$, the output from the scanning circuits $SRS_1$ through $SRS_{m-1}$ in the pre-stage are input.

The output from each scanning circuit $SRS_i$ is input to the level shifter $LS3_i$ through a logical circuit $LOS_i$ enabled by a latch circuit. The level shifter $LS3_i$ shifts a level on the low potential side of a signal of 0V/5V output from the logical circuit $LOS_i$ to −5V/5V. Thereafter, the level shifter $LS3_i$ outputs the driving signal of −5/5V as converted to the sampling circuit $SMP_i$. As a result, the image data DAT from the control circuit 2 is sampled, and is output to each data signal line $SL_i$.

Figure 4:
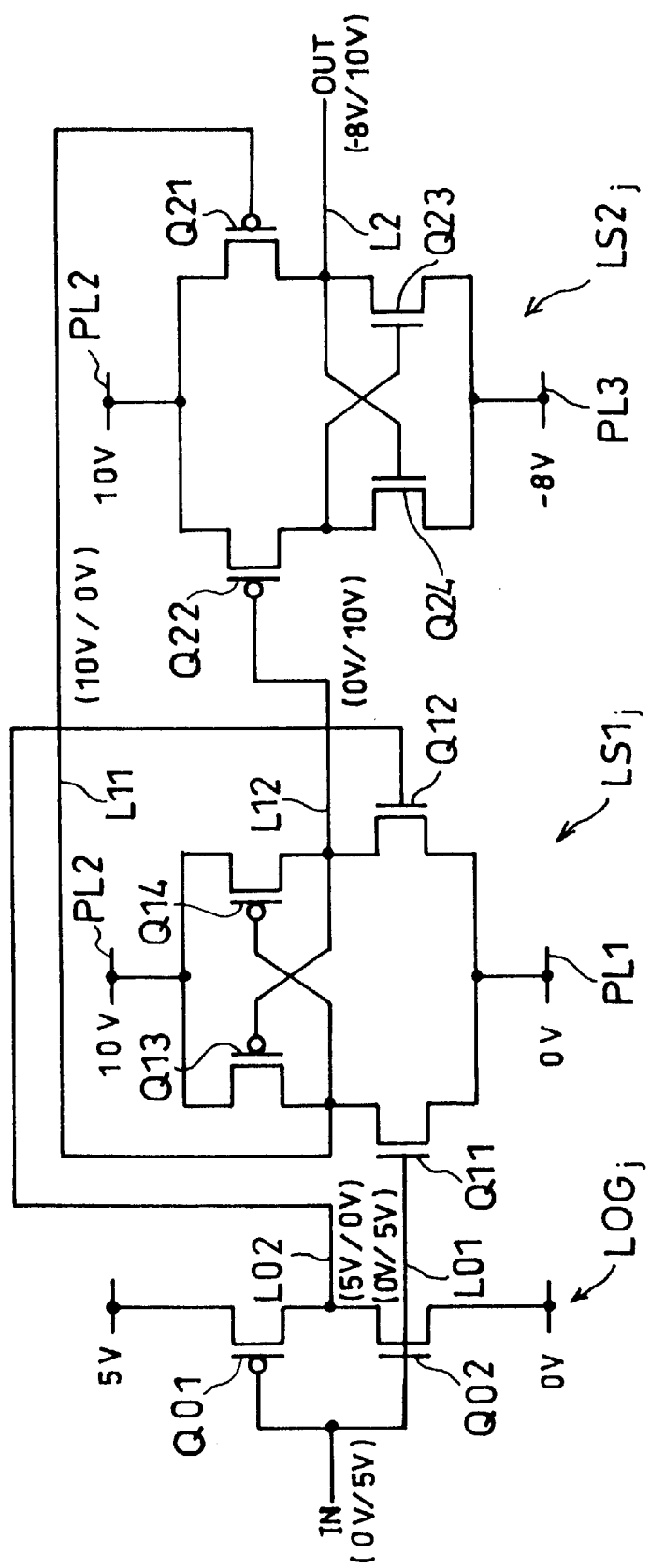
FIG. 4 is an electric circuit diagram showing a structure of a level shifter in the scanning signal line driving circuit shown in FIG. 1.

FIG. 4 is an electric circuit diagram showing a concrete example of the level shifters $LS1_j$ and $LS2_j$ in the scanning signal line driving circuit GD. The output stage of the logical circuit $LOG_j$ is constituted by a CMOS inverter composed of transistors Q01 and Q02. From the output stage, the signals of 0V/5V having mutually opposite phases are respectively output to the two lines L01 and L02.

The respective input signals of 0V/5V to be input from the lines L01 and L02 are input to the respective gates of the transistors Q11 and Q12 of the level shifter $LS1_j$. The transistors Q11 and Q12 are composed of an NMOS, and the respective sources are connected in common to the power source line PL1 at low voltage (0V). The drain of the transistor Q11 is connected to the drain of the transistor Q13 and the gate of the transistor Q14. The drain of the transistor Q12 is connected to the drain of the transistor Q14 and the gate of the transistor Q13. The transistors Q13 and Q14 are composed of the PMOS, and respective sources are connected to a power source line PL2 at high potential (10 V) in common. An output is sent from the respective drains of the transistors Q11 and Q12 to the respective lines L11 and L12.

Therefore, when the line L01 is at 5V, and the line L02 is at 0V, the transistors Q11 and Q14 conduct. In this state, the transistors Q12 and Q13 cut off, and the line L11 is at 0 V, and the line L12 is at 10 V. In contrast, when the line L01 is at 0 V, and the line L02 is at 5 V, the transistors Q11 and Q14 cut off. Here, the transistors Q12 and Q13 conduct, and the lines L11 and L12 become at 10 V and 0V respectively. As a result, the voltage level on the high potential side of the input signal level of 0V/5V from the logical circuit $LOG_j$ is shifted to 10 V by this level shifter $LS1_j$.

The lines L11 and L12 are respectively connected to the gates of the transistors Q21 and Q22 of the level shifter $LS2_j$. The transistors Q21 and Q22 are composed of the PMOS, and the respective sources are connected to the power source line PL2 at 10 V. The drain of the transistor Q21 is connected to the drain of the transistor Q23 and the gate of the transistor Q24. The drain of the transistor Q22 is connected to the drain of the transistor Q24 and the gate of the transistor Q23. The transistors Q23 and Q24 are composed of the NMOS, and the respective sources are connected in common to the power source line PL3 at −8V. To the respective drains of the transistors Q21 and Q23, the output line L2 for the buffer $BUF_j$ is connected.

Therefore, when the line L11 is at 10 V, and the line L12 is at 0V, the transistors Q22 and Q23 conduct. Here, the transistors Q21 and Q24 cut off, and the output line L2 is set at −8V. In contrast, when the line L11 is at 0V, and the line L12 is at 10 V, the transistors Q21 and S24 conduct. Here, the transistors Q22 and Q23 cut off, and the output line 2 is set at 10 V. As a result, the voltage level of the low potential side is shifted from 0V to −8V and then output by the level shifter $LS2_j$.

The level shifter $LS3_i$ of the data signal line driving circuit SD shifts the voltage level on the low potential side of the input signal level of 0V/5V from the logical circuit $LOS_i$ to −5V. The level shifter $LS3_i$ has the same arrangement as the level shifter $LS2_j$ of the scanning signal line driving circuit GD.

As described, the element structure of the transistor which constitutes the signal line driving circuits GD and SD having the described arrangements is shown, for example, in FIG. 5(a) through FIG. 5(f). FIGS. 5(a) through (f) are cross-sectional views schematically showing the element structure of the transistor which constitutes the signal line driving circuits GD and SD. In these FIG. 5(a) through FIG. 5(f), TG, TS, and TD respectively indicate the gate electrode, the source electrode and the drain electrode. The legend CNL indicates a channel region, and the legend RAY indicates a gate insulating film.

Figure 5:
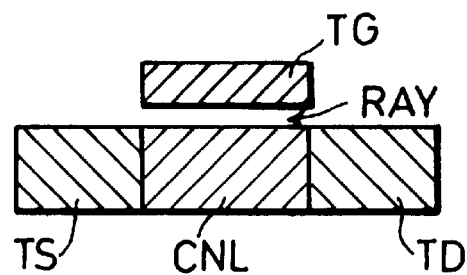
Figure 5:
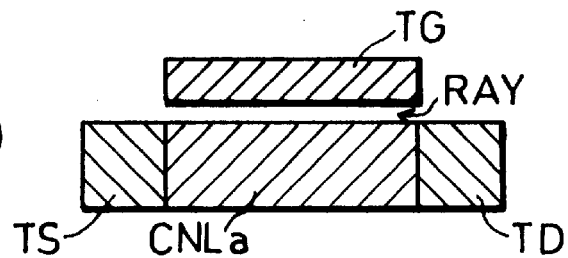
Figure 5:
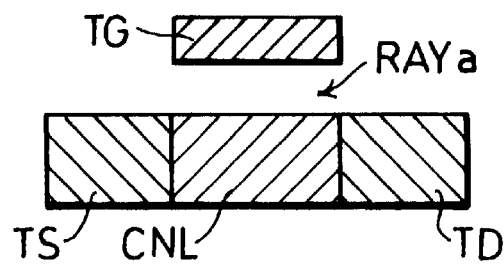
Figure 5:
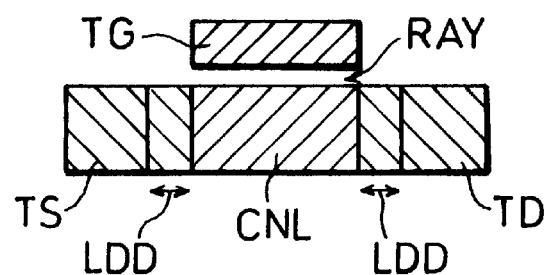
Figure 5:
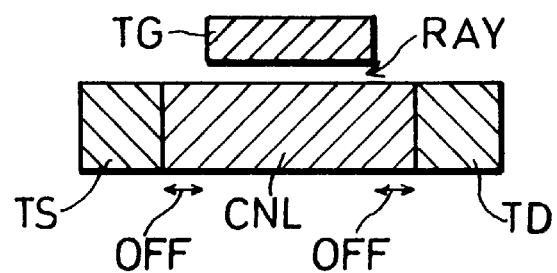
Figure 5:
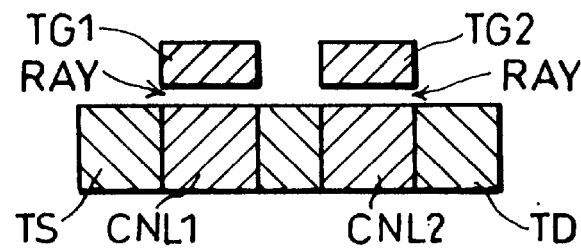

FIG. 5(a) is a cross-sectional view showing a transistor for use in the scanning circuits $SRG_j$ and $SRS_i$ and logical circuits $LOG_j$ and $LOS_i$. The transistor has the simplest structure called "single drain structure". In this transistor, a source region TS and a drain region TD are formed by a self-alignment by an ion doping in which the gate electrode TG serves as a mask.

In contrast, the transistors for use in the level shifters $LS1_j$, $LS2_j$ and $LS3_i$, the buffer $BUF_j$ and the sampling circuit $SMP_i$ have high withstanding voltage. The transistor may have any of the structures shown in FIG. 5(b) through FIG. 5(f).

The transistor shown in FIG. 5(b) is arranged so as to have a longer channel than that of the transistor shown in FIG. 5(a) as designated by the legend "CNLa".

It is generally known that as the channel becomes longer, an electric field between the source and the drain is relaxed, and an improved element withstanding voltage (a withstanding voltage between the source and the drain, an application voltage at which performances of the transistors do not deteriorate after a long operation) can be achieved. On the other hand, the longer is the channel length, the lower would be the performances of the transistor (driving capacitor). Namely, when adopting the transistor having a too long channel, the characteristics of the signal line driving circuits GD and SD, or the characteristics of the entire display device would be lowered. Therefore, in order to fully appreciate the characteristics of the signal line driving circuits GD and SD, or the characteristics of the entire display device, the upper limit is set for the channel length of the transistor as shown in FIG. 5(b).

The active layer of the transistor shown in FIG. 5(b) can be manufactured by polycrystallizing the amorphous silicon thin film. There are a plurality of methods of polycrystallizing the amorphous silicon thin film, which can be roughly classified into (i) a polycrystallizing method by a heat treatment, (ii) a polycrystallizing method by a projection of a laser beam, and (iii) a polycrystallizing method in combination of the method (i) and the method (ii). Furthermore, the amorphous silicon thin film may be polycrystallized by adopting a method in combination of the above methods (i)–(iii) and (iv) a polycrystallizing method which adopts a metal catalyst for accelerating the crystallization. When forming the active layer by the described method, depending on various conditions such as a temperature and an application time of the heat treatment, an output of a laser beam, etc., a relationship between a channel length and an element withstanding voltage of the transistor to be formed varies.

For example, in a polycrystalline silicon thin film transistor #1 which offers an element withstanding voltage in a range of from 5 to 7 V at a channel length of 3 μm manufactured by polycrystallizing the amorphous silicon thin film by a certain method under certain conditions, in order to ensure an element withstanding voltage of not less than 10 V, a channel length of at least 4.5 μm is required, and in order to ensure an element withstanding voltage of not less than 15 V, a channel length of at least 6 μm is required. Additionally, for this transistor #1, in order to prevent the damage on the characteristics of the signal line driving circuits GD and SD and the characteristics of the entire display device, it is preferable to set the channel length to not more than 10 μm, and still more preferably not less than 8 μm.

In a transistor #2 which offers an element withstanding voltage of from 5 to 7 V at a channel length of 2 μm manufactured by adopting different method and conditions from those adopting for the transistor #1, in order to ensure the element withstanding voltage of not less than 10 V, a channel length of at least 3 μm is required. In order to ensure the element withstanding voltage of not less than 15 V, a channel length of not less than 4.5 μm is required. It is preferable to set the upper limit of the channel length in this transistor #2 to 8 μm and more preferably to 6 μm.

In a transistor #3 which offers an element withstanding voltage of from 5 to 7 V at a channel length of 4 μm manufactured by adopting different method and conditions from those adopting for the transistors #1 and #2, in order to ensure the element withstanding voltage of not less than 10 V, a channel length of at least 6 μm is required, and in order to ensure the element withstanding voltage of not less than 15 V, a channel length of not less than 8 μm is required. It is preferable to set the upper limit of the channel length in this transistor to 12 μm and more preferably to 10 μm.

For example, in the arrangement of the scanning signal line driving circuit GD shown in FIG. 1, as a transistor for the scanning circuit $SRG_j$ and the logic circuit $LOG_j$, the transistor shown in FIG. 5(a) having a channel length of 3 μm is adopted and is driven at a driving voltage of 5 V. On the other hand, as a transistor for the level shifters $LS1_j$ and $LS2_j$ and the buffer $BUF_j$, the transistor shown in FIG. 5(b) having a channel length of 7 μm is used, and is driven at a voltage of from 10 V to 18 V. The described arrangement enables the scanning signal line driving circuit GD which offers a high reliability and high speed to be achieved.

As described, the relationship between the channel length and an improvement in element withstanding voltage varies depending on a manufacturing method of the transistor (especially an active layer), a structure of the transistor (size, etc.). However, when adopting the signal line driving circuits GD and SD, as long as the channel length in the transistor shown in FIG. 5(b) is in a range of from 1.5 times to 3 times of that of the transistor shown in FIG. 5(a), a desirable element withstanding voltage can be ensured irrespectively of the method and conditions for polycrystallizing the amorphous silicon thin film for use in forming the active layer of the transistor and the structure of the transistor (size, etc.). As long as a ratio of the transistors for use in the level shifters $LS1_j$, $LS2_j$ and $LS3_j$ and the channel length in the circuit on the pre-stage fall in the described range, the signal line driving circuits GD and SD operate most efficiently.

The transistor shown in FIG. 5(c) is arranged so as to have a thicker gate insulating film as designated by the legend "RAYa" than the transistor shown in FIG. 5(a).

It is generally known that as the gate insulating film becomes thicker, the element withstanding voltage is improved in proportion. However, it is also known that depending on the film forming method, the withstanding voltage may be dropped abruptly at a film thickness of not more than a predetermined thickness due to defects, etc. On the other hand, the thicker is the gate insulating film, the lower is the performance (driving capacity) of the transistor. When adopting the transistor having a too thick gate insulating film, characteristics of the signal line driving circuits GD and SD, or the characteristics of the entire display device are consequently damaged. Therefore, in order to fully appreciate the characteristics of the signal line driving circuits GD and SD, or characteristics of the entire display device, the upper limit is set for the film thickness of the gate insulating film of the transistor shown in FIG. 5(c) is determined.

The gate insulating film of the transistor shown in FIG. 5(c) is manufactured by the CVD method (Chemical Vapor Deposition method). The CVD method can be classified into a thermal CVD method, a plasma CVD method, etc., and a quality of the gate insulating film to be manufactured differs depending on various conditions such as a type of a gas, a reaction temperature, etc. Therefore, a relationship between the film thickness of the gate insulating film of the transistor and the element withstanding voltage of the transistor to be formed differ depending on respective conditions.

For example, in a polycrystalline silicon thin film transistor #11 which offers an element withstanding voltage of around 10 V and includes a gate insulating film having a film thickness of 80 nm manufactured by a certain method under certain conditions, in order to ensure the element withstanding voltage of not less than 15 V, a film thickness of the gate insulating film of at least 100 nm is required, and in order to ensure the element withstanding voltage of not less than 20 V, a gate insulating film having a thickness of at least 120 nm is required. Additionally, for this transistor #11, in order to prevent the damage on the characteristics of the signal line driving circuits GD and SD and the characteristics of the entire display device, it is preferable to set the film thickness of the gate insulating film to not more than 200 nm and more preferably not more than 150 nm.

In a polycrystalline silicon thin film transistor #12 which offers an element withstanding voltage of around 10 V and includes a gate insulating film having a film thickness of 90 nm manufactured by adopting different method and conditions from those adopted for the polycrystalline silicon thin film transistor #11, in order to ensure the element withstanding voltage of not less than 15 V, a film thickness of the gate insulating film of at least 110 nm is required, and in order to ensure the element withstanding voltage of not less than 20 V, a gate insulating film having a thickness of not less than 130 nm is required. Additionally, in this transistor #12, the upper limit of the film thickness of the gate insulating film in this transistor is preferably 220 nm and more preferably 180 nm.

In a polycrystalline silicon thin film transistor #13 which offers an element withstanding voltage of around 10 V and includes a gate insulating film having a film thickness of 100 nm manufactured by adopting different method and conditions from those adopted for the polycrystalline silicon thin film transistors #11 and #12, in order to ensure the element withstanding voltage of not less than 15 V, a film thickness of the gate insulating film of at least 125 nm is required, and in order to ensure the element withstanding voltage of not less than 20 V, a gate insulating film having a thickness of at least 150 nm is required. Additionally, in this transistor #13, the upper limit of the film thickness of the gate insulating film in this transistor is preferably 250 nm and more preferably 220 nm.

For example, in the arrangement of the scanning signal line driving circuit GD shown in FIG. 1, as a transistor for use in the scanning circuit $SRG_j$ and the logic circuit $LOG_j$, the transistor including the gate insulating film having a film thickness of 80 nm shown in FIG. 5(a) is adopted, and is driven at a driving voltage of 5 V, and as the transistor for use in the level shifters $LS1_j$, $LS2_j$ and the buffer $BUF_j$, the transistor shown in FIG. 5(c) including the gate insulating film having a film thickness of 120 nm is used, and is driven at a driving voltage in a range of from 10 V to 18 V. The described arrangement enables the scanning signal line driving circuit GD which offers a high reliability and high speed to be achieved.

As described, the relationship between the film thickness and the improvements in the element withstanding voltage differs depending on factors such as the method of forming the gate insulating film, conditions for heat treatment and the structure (size, etc.) of the transistor, etc. For example, in the case of adopting the transistor in the signal line driving circuits GD and SD, if the transistor shown in FIG. 5(c) has a gate insulating film having a thickness in a range of from 1.25 times to 2.5 times of the gate insulating film of the transistor shown in FIG. 5(a), a desirable element withstanding voltage can be obtained irrespectively of the conditions for the CVD method for forming the gate insulating film, the structure of the transistor (size, etc.). When the ratio of the film thickness of the gate insulating film of the transistor for use in the level shifters $LS1_j$, $LS2_j$ and $LS3_j$ of the signal line driving circuits GD and SD and the transistor for use in the circuit in the pre-stage falls in the described range, the signal line driving circuits GD and SD can operate most efficiently.

The transistor shown in FIG. 5(d) has a so-called "LDD structure". In this transistor, respective regions having a low impurity density, i.e., the regions having a relatively small amount of dopant per area (LDD region, Lightly Doped Drain Region) designated by the legend "LDD" are formed between the channel region CNL and the source region TS and between the channel region CNL and the drain region TD.

The factors which actually affect the characteristics of the transistor are the impurity density per volume; however, as a manufacturing condition, an amount of dopant per area is defined to be a characteristic of the LDD region. In the normal manufacturing process of the transistor, it is set such that most injected impurities enter in the active layer, an impurity density per volume is obtained by dividing the amount of dopant per area by the film thickness of the active layer. In this case, an amount of a dopant per area in the source region TS and the drain region TD is in a range of from $1 \times 10^{15}$ to $5 \times 10^{15}/cm^2$. In contrast, an amount of dopant per area in this LDD region is preferably in a range of from $1 \times 10^{12}$ to $1 \times 10^{14}/cm^2$, and more preferably in a range of from $5 \times 10^{12}$ to $5 \times 10^{13}/cm^2$.

As described, it is known that by relaxing an electric field between the source and the drain, an element withstanding voltage can be improved. Specifically, the electric field can be relaxed by adopting the LDD structure (Lightly Doped Drain structure) wherein a junction region of the transistor (pn junction region between the source and the drain) is selected to be the LDD region having a small amount of a dopant per area, and the electric field is relaxed by expanding the width of a depletion layer in this region.

The junction region of the transistor shown in FIG. 5(d) is manufactured by a self-aligned injection. The relationship between an amount of the dopant per area and the relaxation of the electric field between the source and the drain differs depending on the manufacturing method of the transistor (particularly, the junction region). For example, in the case of the transistor having a junction region prepared by a self-aligned injection and has a channel length of 5 μm prepared by a certain method, the element withstanding voltage (application voltage at which the transistor does not deteriorate during a long operation) is in a range of around 5 to 7 V. In contrast, in the transistor having an LDD region having an area of $2 \times 10^{13}/cm^2$, an amount of a dopant per area of from $5 \times 10^{12}$ to $5 \times 10^{13}/cm^2$, the element withstanding voltage of not less than 15 V can be ensured with the channel length of 5 μm.

In the described transistor, an amount of the dopant per area of the LDD region is determined in such a manner that the resistance in this region is substantially the same as an ON resistance of the channel. When an amount of the dopant per area in this region is larger than $1 \times 10^{14}/cm^2$, the resistance in this region becomes too small, and the voltage is mostly applied to the channel region of the transistor. Thus, the electric field between the source and the drain cannot be relaxed. Additionally, when the amount of the dopant per area in this region is not more than $1 \times 10^{12}/cm^2$, although an improved reliability of the transistor can be achieved, the resistance in this region becomes too large, and consequently, the driving capacitor of the transistor is significantly reduced. Therefore, the amount of the dopant per area in the LDD region of the transistor shown in FIG. 5(d) is preferably in a range of from $1 \times 10^{12}$ to $1 \times 10^{14}/cm^2$, and more preferably in a range of from $5 \times 10^{12}$ to $5 \times 10^{13}/cm^2$ in the case of applying the transistor to the signal line driving circuits GD and SD.

When forming the LDD region of the transistor by the self-aligned injection, the relationship between the amount of dopant per area and the element withstanding voltage in the LDD region differs depending on the film quality of the active layer, the interface state between the gate insulating film and the active layer, the width of the LDD region, the kind of injected impurities, injection energy and the activation condition for the injected impurities, etc.; however, a desirable element withstanding voltage can be obtained as long as the amount of the dopant per area falls in the above-defined range.

For example, in the arrangement of the scanning signal line driving circuit GD shown in FIG. 1, as a transistor for the scanning circuit SRG$_j$ and the logic circuit LOG$_j$, the transistor shown in FIG. 5(a) having a single drain structure (without having the LDD region) is adopted, and is driven at a driving voltage of 5 V, and as a transistor for the level shifters LS1$_j$, LS2$_j$ and the buffer BUF$_j$, the transistor shown in FIG. 5(d) including the LDD region having an amount of the dopant per area of $2\times10^{13}/cm^2$ is adopted and is driven at a driving voltage in a range of from 10 V to 18 V. The described arrangement enables the scanning signal line driving circuit GD which offers a high reliability and high speed to be achieved.

The transistor shown in FIG. 5(e) has an offset structure. This transistor has offset regions formed between the channel region CNL and the source region TS, and between the channel region CNL and the drain region TD. These offset regions suggest the regions designated by the legend "OFF" where an impurity element is not doped. The transistor shown in FIG. 5(f) is a transistor having a so-called "multigate structure". The transistor is arranged so as to have a plurality of channels connected in series as designated by the legend CNL 1 and CNL 2.

The respective transistors having the structures of FIG. 5(d) through FIG. 5(f) offer a higher withstanding voltage between the source and the drain than that of the transistor having the structure shown in FIG. 5(a) if the channel length and the gate thickness are the same. Therefore, the withstanding voltage of the transistor can be increased also by adopting any of the described structures. The structures shown in FIG. 5(b) and FIGS. 5(d) through 5(f) may be achieved in the same process as the structure shown in FIG. 5(a). Therefore, such structure is very effective especially in the point that the high cost is not required. Furthermore, by applying at least one of the structures shown in FIG. 5(b) and FIG. 5(c) to the respective transistors having the structures shown in FIGS. 5(d) through 5(f), further improvements in the withstanding voltage can be achieved. As described, the withstanding voltage can be obtained as desired in respective transistors of the signal line driving circuits GD and SD, and a reliability of the signal line driving circuits GD and SD can be improved.

Figure 6:
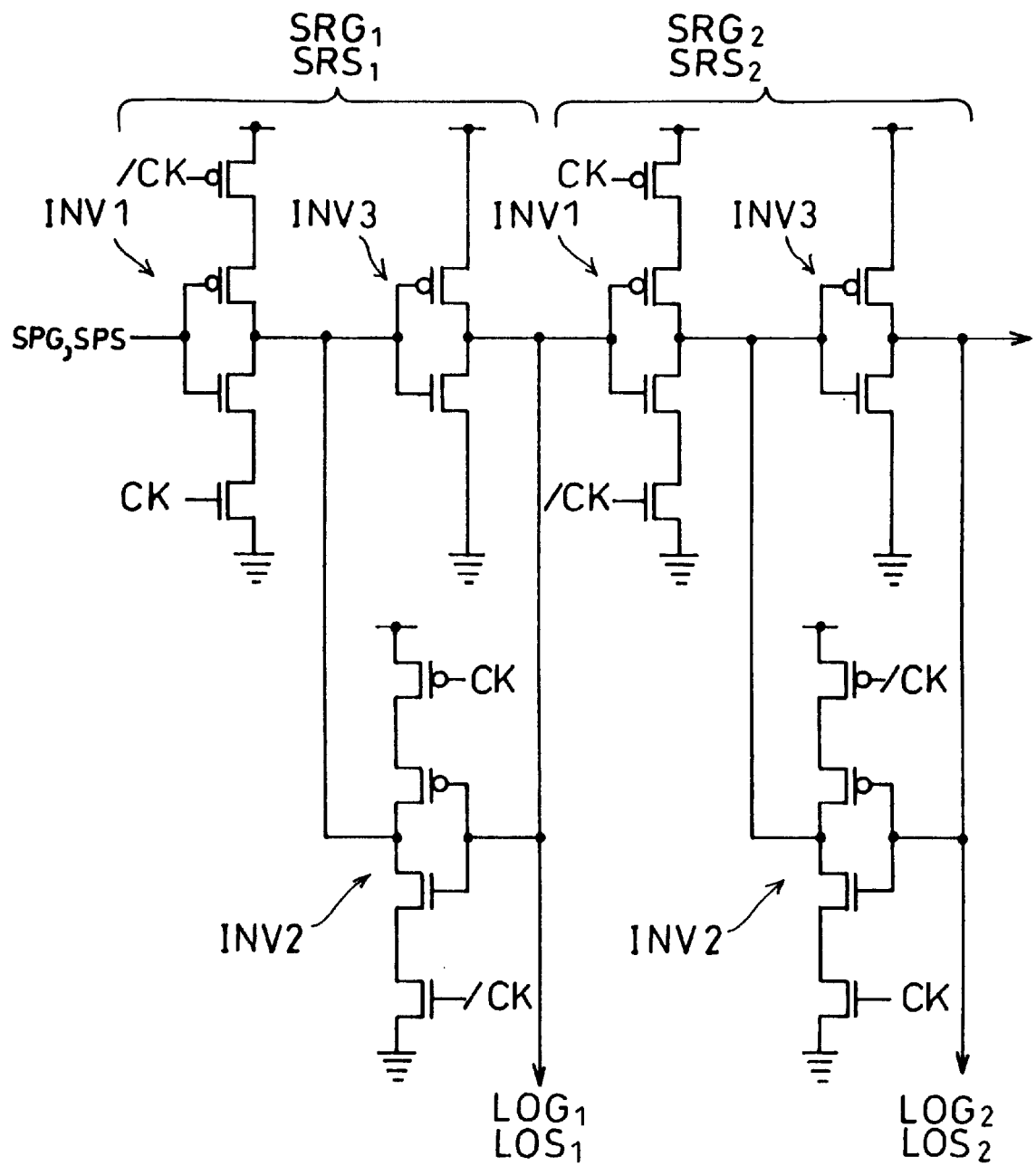
FIG. 6 is an electric circuit diagram showing one example of the scanning signal line driving circuit shown in FIG. 1 and the data signal line driving circuit shown in FIG. 3.

The scanning circuits SRG$_j$ and SRS$_i$ are enabled, for example, by the structure shown in FIG. 6. As shown in the figure, respective scanning circuits SRG$_j$ and SRS$_i$ include two clocked inverters INV1 and INV2 having the CMOS structure and the inverter INV3. To the input terminal of the inverter INV1, the start pulse SPG, SPS or an output from the scanning circuit in the pre-stage is input. In FIG. 6, to the clock input terminal designated by the legend CK, the clock signals CKG and CKS are input. To the clock input terminal designated by the legend "CK", the clock signals obtained by reversing the clock signals CKG and CKS are input.

The output from the inverter INV1 is inverted by the inverter INV3, and then output to the logic circuits LOG$_j$ and LOS$_i$ and to the scanning circuit in the post-stage. Additionally, the output is fed back to the input side of the inverter INV3 by the inverter INV2. As described, respective scanning circuits SRG$_j$ and SRS$_i$ can sequentially hold the start pulses SPG and SPS for one period of the clock signals CKG and CKS in response to the clock signals CKG and CKS.

Figure 7:
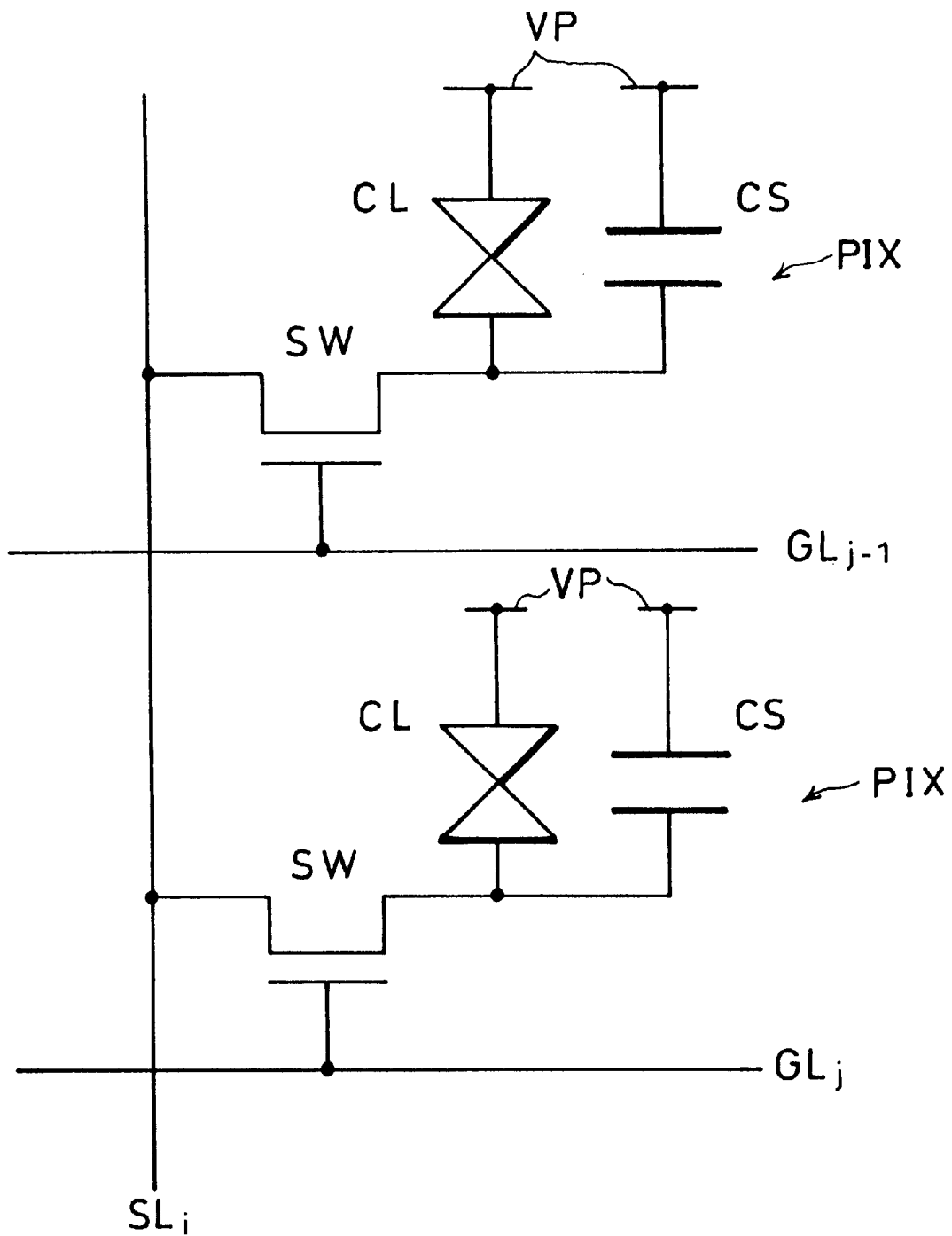
FIG. 7 is an electric circuit diagram schematically showing an electric structure of a pixel in a liquid crystal display device in accordance with on e embodiment of the p resent invention.

Additionally, the pixel PIX to be driven by the signal line driving circuits GD and SD having the described arrangement has a structure of, for example, FIG. 7. FIG. 7 is an electric circuit diagram which schematically shows an electric structure in each pixel PIX. Each pixel PIX mainly includes an electric field effect transistor SW (switching element) and a pixel capacitor for applying a signal level taken in by the electric field transistor SW to one electrode. The electric field effect transistor SW is selected when the scanning signal line GL$_j$ becomes high level, and takes in the signal level of the data signal line SL$_i$. The pixel capacitor is composed of a liquid crystal capacitor CL and if necessary an auxiliary capacitor CS.

When the scanning signal line GL$_j$ becomes high level, the drain and the source of the electric field effect transistor SW conduct. Here, the data signal line SL$_i$ is connected to one electrode of the liquid crystal capacitor CL and to one electrode of the auxiliary capacitor CS. The other electrode of the liquid crystal capacitor CL is connected to the counter electrode VP in common for all pixels. The other electrode of the auxiliary capacitor CS is connected to the counter electrode VP in the same manner as the liquid crystal capacitor CL in the case of the CS-on-Common structure shown in FIG. 7. As described, a voltage taken in through the data signal line SL$_i$ is applied to the liquid crystal capacitor CL, thereby modulating a transmittance or a reflectance of liquid crystals to display an image by each picture element PIX.

The CS-on-Common structure shown in FIG. 7 can reduce the capacity of the scanning signal line GL$_j$, thereby reducing a load of the scanning signal line driving circuit GD, and can be desirably applied to a pixel array of a relatively large area.

As described, the scanning signal line driving circuit GD and the data signal line driving circuit SD of the present invention are arranged so as to convert an input signal level from the external circuit to apply an optimal driving signal level to each pixel PIX. This driving signal level corresponds to the element structure of the electric field effect transistor SW of each pixel PIX and an image signal level. The supply of the optimal driving signal level is permitted at any voltage level as long as the input signal level from the external circuit falls within a range where the signal line driving circuits GD and SD operate properly. The external circuit suggests the control circuit 2 for generating the clock signal CKG, CKS, etc., or the image signal processing circuit. Here, the voltage level shift by these signal line driving circuits GD and SD are carried out by the level shifters LS1$_j$, LS2$_j$ and LS3$_i$.

Therefore, the external circuit does not require an additional interface circuit, etc., thereby achieving a simplified structure and a low power consumption. Additionally, as the pixel PIX can be driven at an optimal driving signal level, a high quality display can be obtained.

It is further arranged such that the level shifters LS1$_j$, LS2$_j$ and LS3$_i$, and the buffer BUF$_j$ and the sampling circuit SMP$_i$ in its post-stage have different element structure from those of the scanning circuits SRG$_j$, SRS$_i$ and the logic circuits LOG$_j$ and LOS$_i$ in the pre-stage of the level shifters LS1$_j$, LS2$_j$ and LS3$_i$. As a result, a withstanding voltage corresponding to a voltage to be used can be obtained, thereby achieving a high reliability.

Furthermore, in general, the output stage of the data signal line driving circuit SD (sampling circuit SMP$_i$ in an example of FIG. 3) has a CMOS structure, while the electric field effect transistor SW of the pixel PIX has a single channel (N-channel in an example of FIG. 7). Therefore, the scanning signal line driving circuit GD has a higher voltage on a high potential side required in response to an output of high potential level that of the data signal line driving circuit SD. Additionally, the electric field effect transistor SW should hold image data DAT for a longer period than the output stage (electric field effect transistor SW: 1 field, and the output stage of the data signal line driving circuit SD: 1 horizontal scanning period). For this reason, the scanning signal line driving circuit GD has a lower potential side voltage requested when holding the lower voltage level than that of the data signal line driving circuit SD.

Therefore, in the present invention, one driving voltage (5V in an example of FIG. 3) of the data signal line driving circuit SD is fixed, and the other driving voltage (0V) of the data signal line driving circuit SD and the driving voltage of the scanning signal line driving circuit GD are shifted. According to the described arrangement, the maximum amounts of shift of the level shifters $LS1_j$, $LS2_j$ and $LS3_i$ can be made smaller than that in the case of adopting the method wherein the driving voltage of one side of the scanning signal line driving circuit GD is fixed, and other three driving voltages are shifted.

For example, in the case of the scanning signal line driving circuit GD shown in FIG. 1 and FIG. 4, an amount of shift of the level shifter $LS2_j$ is −8V. In contrast, when one driving voltage of the scanning signal line driving circuit GD is fixed, for example, at 5V on the high potential side, it is required to set the amount of shift of the level shifter $LS2_j$ to be −13 V. As described, as the amount of shift of the level shifters $LS1_j$, $LS2_j$ and $LS3_i$ becomes large, the respective operations become unstable, and a signal delay increases. In contrast, the scanning signal line driving circuits GD and SD in the present invention are arranged so as to fix one potential of the data signal line driving circuit SD, thereby eliminating the described inconveniences.

[Second Embodiment]

The second embodiment of the present invention will be described below.

Here, members having the same function as those of the aforementioned embodiment will be designated by the same reference numerals, and thus the descriptions thereof shall be omitted here.

Figure 8:
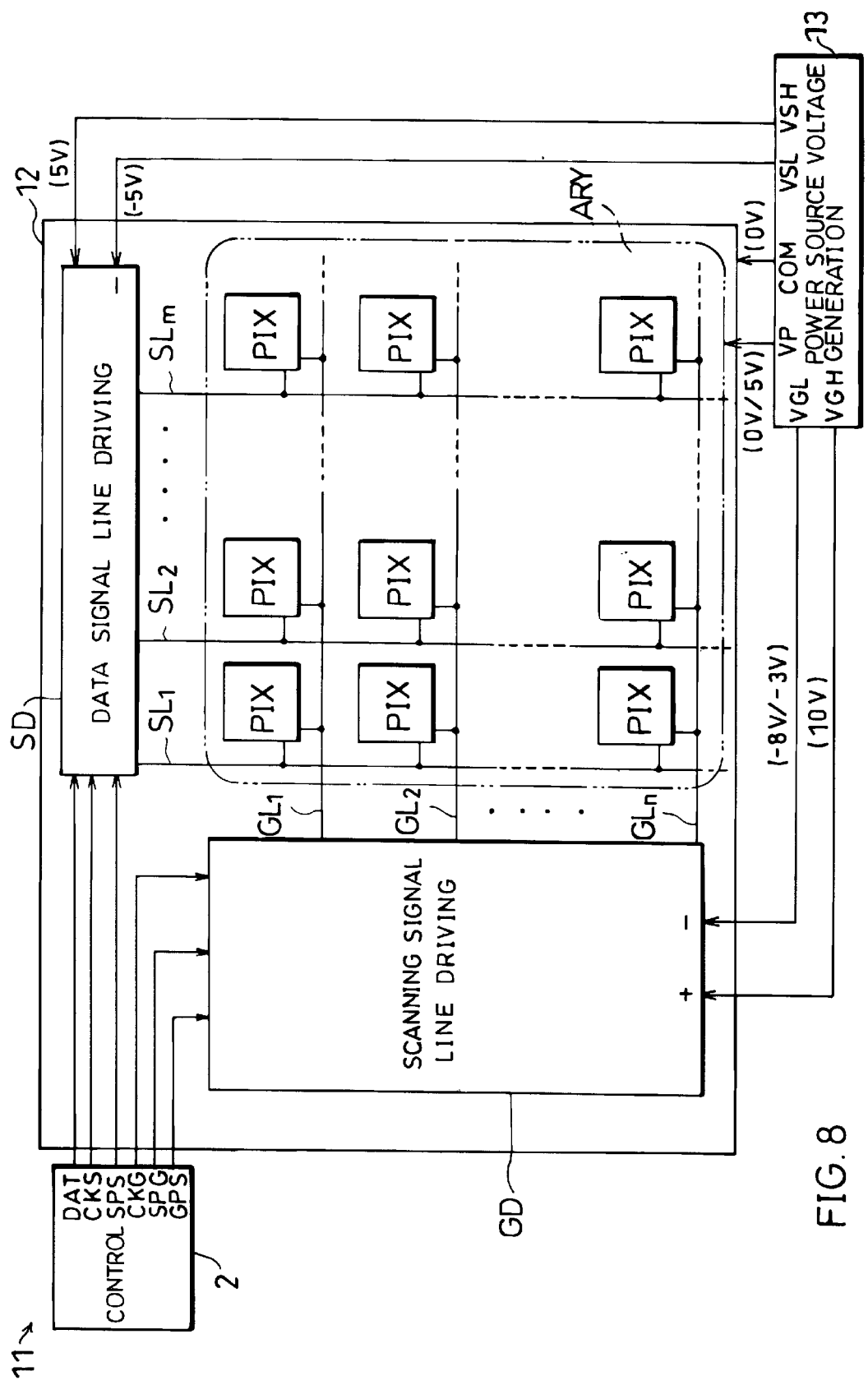
FIG. 8 is a front view schematically showing a structure of the liquid crystal display device in accordance with another embodiment of the present invention.

FIG. 8 is a front view showing a schematic structure of the liquid crystal display device 11 in accordance with the present embodiment. In the liquid crystal display device 11, the signal line driving circuits GD and SD are integrally formed on a common substrate 12 with a picture element array ARY.

Figure 11:
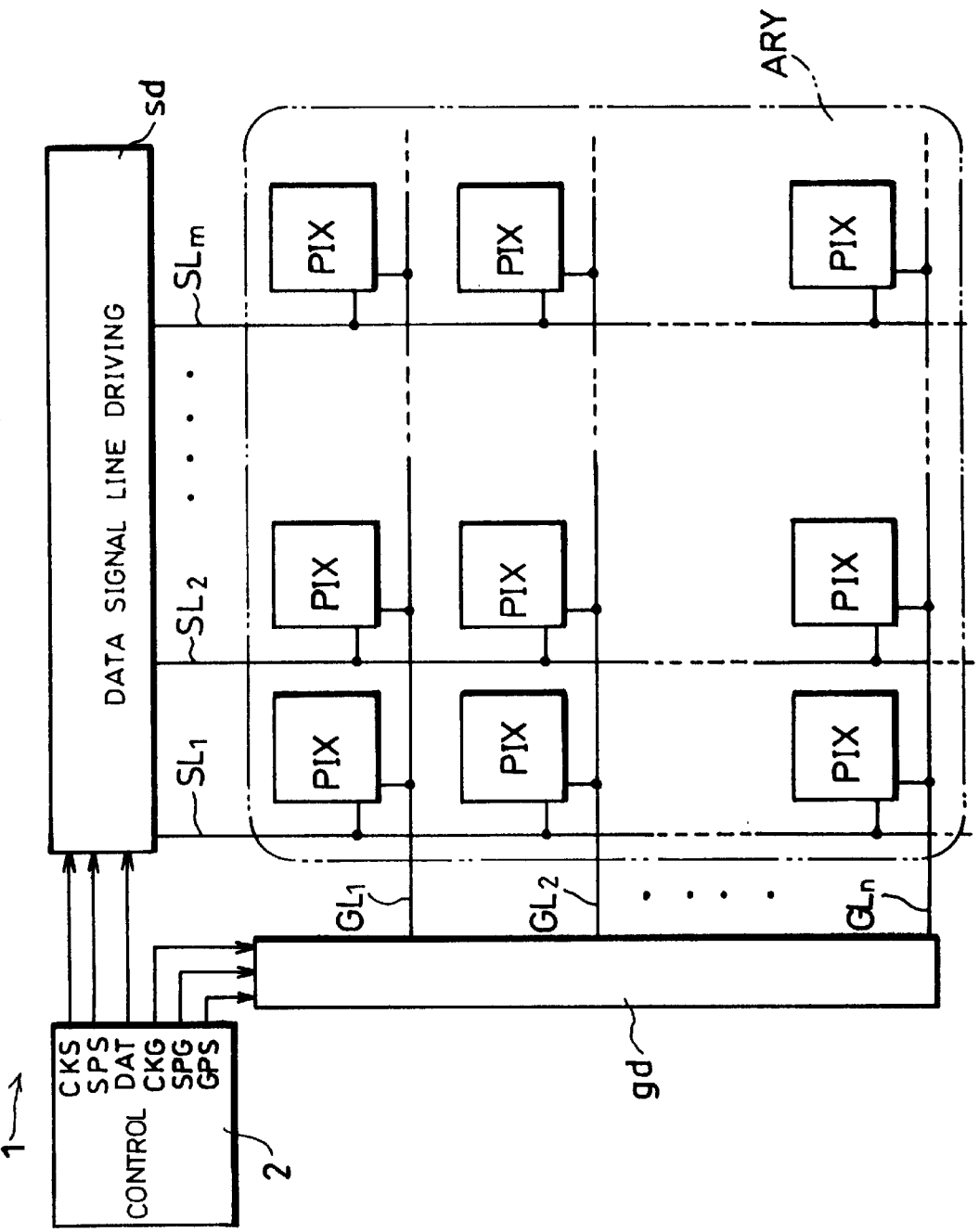
FIG. 11 is a front view schematically showing a structure of the generally used liquid crystal display device.
Figure 12:
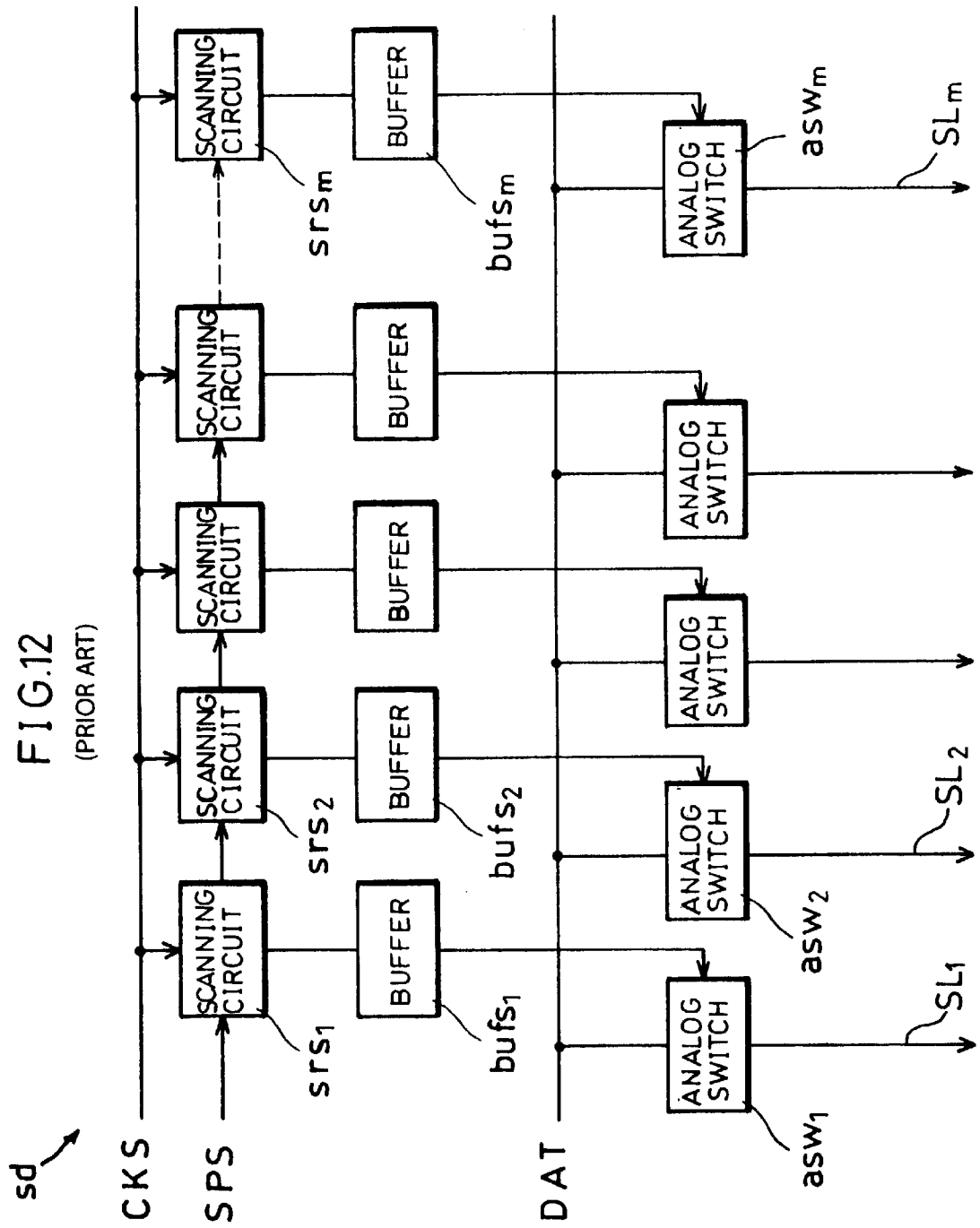
FIG. 12 is a block diagram showing an electric structure of the data signal line driving circuit adopted in a typical conventional liquid crystal display device.
Figure 13:
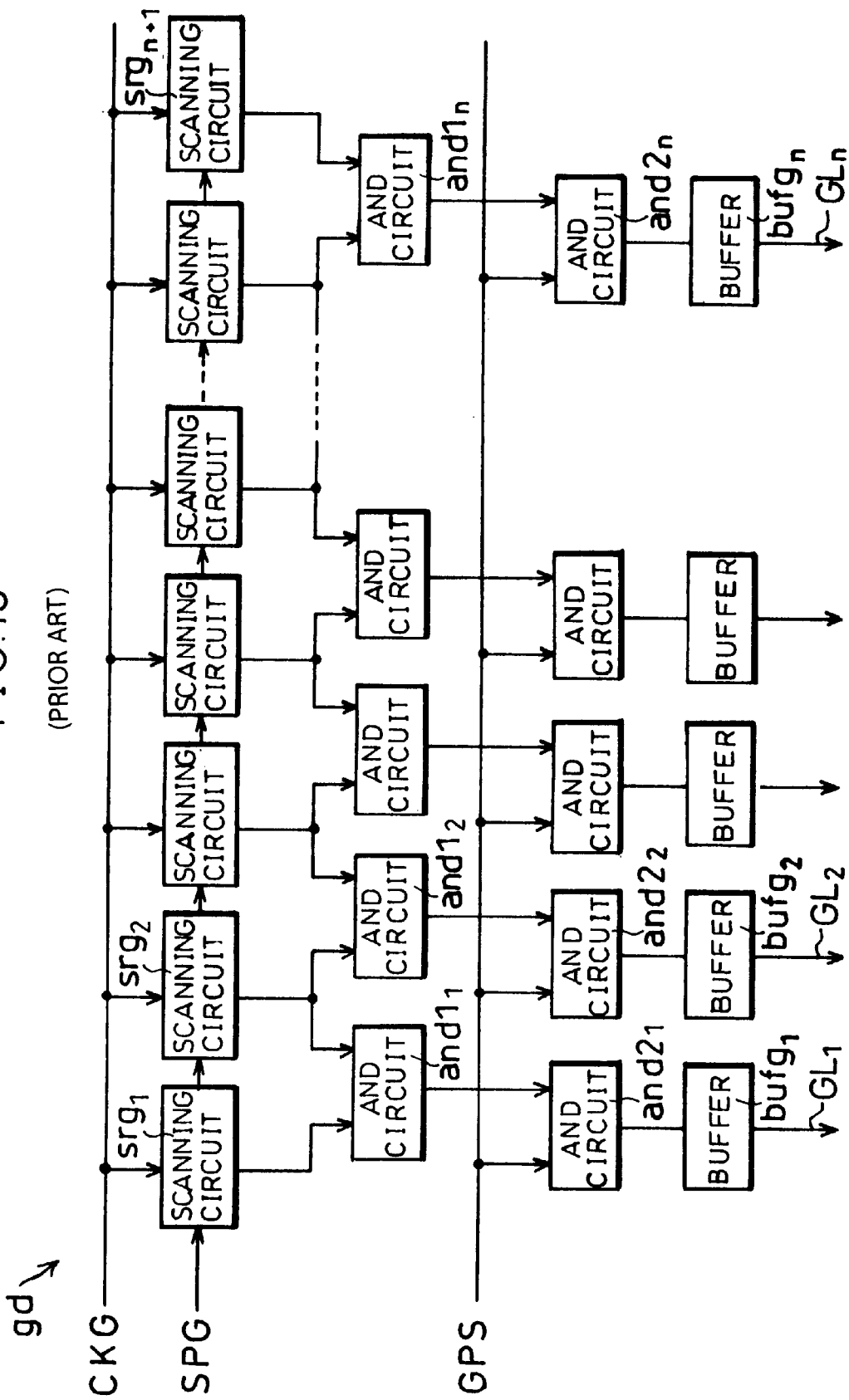
FIG. 13 is a block diagram showing an electric structure of a scanning signal line driving circuit in a typical conventional liquid crystal display device.

In the liquid crystal display device 1 shown in FIG. 11, the electric field effect transistor SW of the pixel PIX is made of amorphous silicon. The signal line driving circuits GD and SD are constituted by an integrated circuit to be externally attached to the pixel array ARY.

In contrast, the technique of monolithically forming the pixel array ARY and the signal line driving circuits GD and SD using a polycrystalline silicon film formed on a quartz substrate has been reported. This is to achieve improved reliability with respect to the direction of the driving force of the electric field effect transistor SW with an increase in size of the screen or a reduction in mounting cost of the signal line driving circuits GD and SD and mounting. Furthermore, using the glass substrate, at a processing temperature of not more than around 600° C. that is the distortion spot of the glass, an attempt is made to form the electric field effect transistor SW by a polysilicon film. This attempt is made to achieve a larger size screen and a cost reduction. By the described technique, the liquid crystal display device 11 is arranged such that the pixel array ARY, the signal line driving circuits GD or SD is integrally formed on the substrate 12 made of glass. Furthermore, the control circuit 2 and the power source voltage generating circuit 13 are formed on the substrate 12.

The power source voltage generating circuit 13 is arranged so as to output a high level voltage of 5 V from a terminal VSH, and outputs a low level voltage of −5V from the terminal VSL to the data signal line driving circuit SD. The power source voltage generating circuit 13 is also arranged so as to output a common voltage of 0V from the terminal COM and a voltage of 0V/5V of the counter electrode VP from the terminal VP to the substrate 12.

In contrast, the power source voltage generating circuit 13 outputs a high level voltage 10 V from the terminal VGH and outputs a low level voltage from the terminal VGL (−8V or −3V) to the scanning signal line driving circuit GD. This corresponds to an AC driving at the voltage level of the counter electrode VP between 0V and 5V. Namely, although the voltage level on the high potential side of the scanning signal line $GL_j$ remains at 10 V, when the voltage level of the counter electrode VP is 0 V, the voltage level on the low potential side is −8V, while when the voltage level of the counter electrode VP is 5 V, the voltage level on the low potential side is set to −3V. Needless to mention, the voltage (0V/5V) for driving the scanning circuits $SRG_j$ and $SRS_i$ and the logic circuits $LOG_j$ and $LOS_i$ are applied to the signal line driving circuits GD and SD. The structure of the pixel PIX of the liquid crystal display device 11 is shown, for example, in FIG. 9. Each pixel PIX is mainly composed of an electric field effect transistor SW, and a pixel capacitor composed of the liquid crystal capacitor CL and the auxiliary capacitor CS. The gate of the electric field effect transistor SW is connected to the scanning signal line $GL_j$, the drain is connected to the data signal line $SL_i$, and the source is connected to one electrode of the liquid crystal capacitor CL and to one electrode of the auxiliary capacitor CS. To the counter electrode VP, i.e., the other electrode of the liquid crystal capacitor CL, a driving voltage of 5V/0V is applied from the power source voltage generating circuit 13. To the other electrode of the auxiliary capacitor OS, the scanning signal line $GL_{j-1}$ is connected.

In the pixel PIX having the described structure, i.e., the CS-on-Gate structure, it is required to A.C. drive the scanning signal line $GL_{j-1}$, i.e., the other electrode of the auxiliary capacitor CS at the same period and amplitude according to the AC driving of the counter electrode VP. This A.C. driving is performed the alternate driving of the counter electrode VP. Therefore, it is required to vary the voltage corresponding to the off level of the scanning signal line driving circuit GD at the described frequency. The voltage corresponding to the off level is the driving voltage of low potential side as the electric field transistor SW has an NMOS structure of an example shown in FIG. 9.

For example, when the A.C. period is two field periods, in the odd number fields, the driving signal level on the low potential side is set lower than that in the even number fields. Alternatively, in the case of 2 horizontal scanning periods, in the odd number line, the driving signal level on the low potential side is set lower than that of the even number line. As described, in order to vary the driving signal level on the low potential side, it may be arranged so as to vary the amount of shift by the level shifter $LS2_j$. Specifically, the amount of shift is varied by changing a power source voltage to be input to the level shifter $LS2_j$ from the power source voltage generating circuit 13.

As described, by A.C. driving the counter electrode VP, the amplitude of the image data DAT to be output to the data signal line $SL_i$ can be made small, and the power consumption of the data signal line driving circuit SD can be reduced.

FIG. 10(a) through FIG. 10(g) are waveform diagrams explaining the described operation of the liquid crystal device 11. The power source voltage generating circuit 13 of the liquid crystal display device 11 switches −8 V and −3V the output voltage from the terminal VGL to the power source line PL3 between the odd number field and the even number field. Therefore, in the odd number field of −8 V, the operation shown in FIG. 2 is carried out. In contrast, in the even number field of −3V, the operations are as shown in FIG. 10(a) through FIG. 10(g). FIG. 10(a) through FIG. 10(g) correspond to the described FIG. 2(a) through FIG. 2(g). In the even number field, the voltage VP of the counter electrode is 5 V, and the output voltage on the low potential side from the level shifter $LS2_j$ is −3V. As a result, the driving voltage of the scanning signal line $GL_j$ is −3V/10V.

Figure 9:
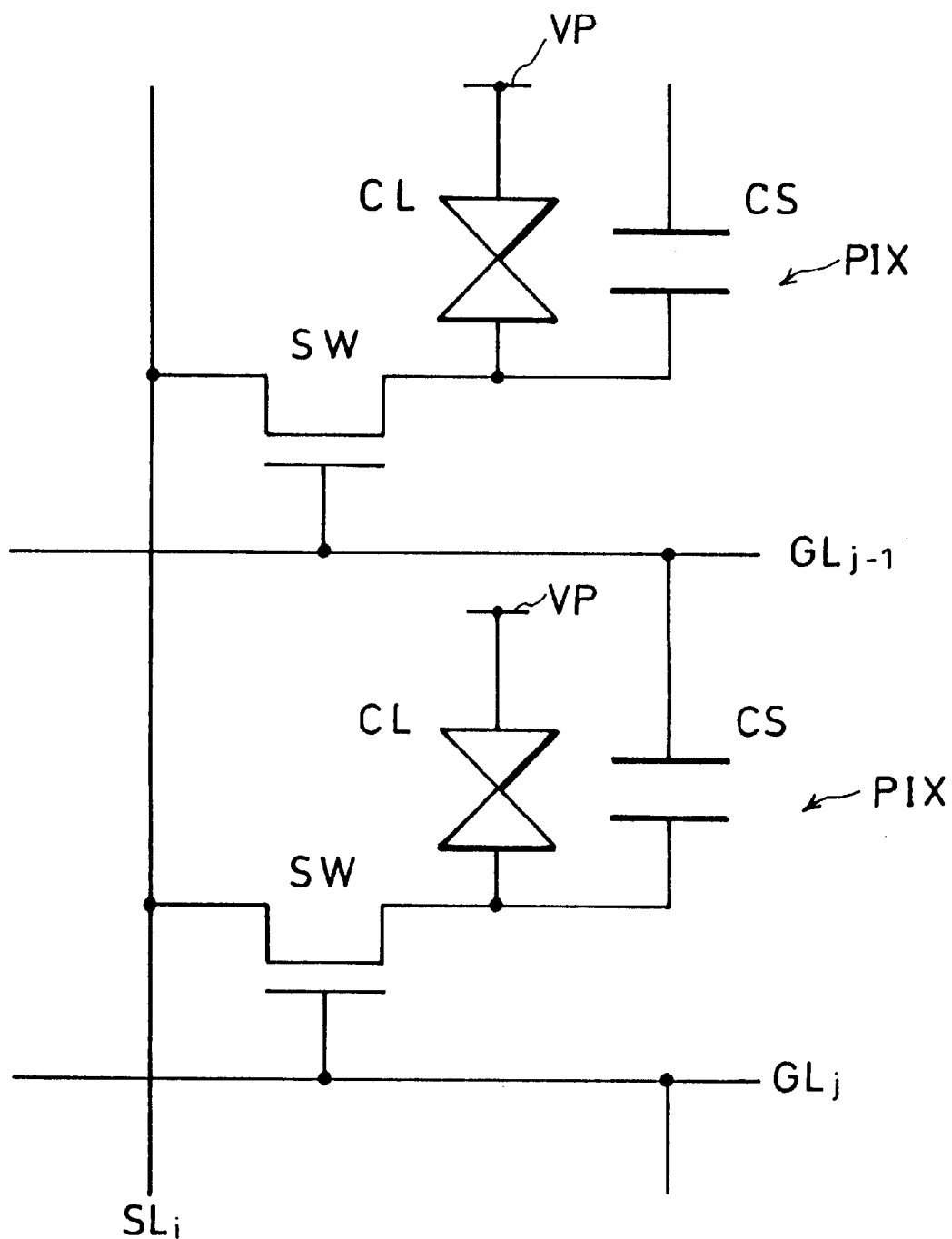
FIG. 9 is an electric circuit diagram schematically showing an electric structure of a pixel in the liquid crystal display device shown in FIG. 8.
Figure 10:
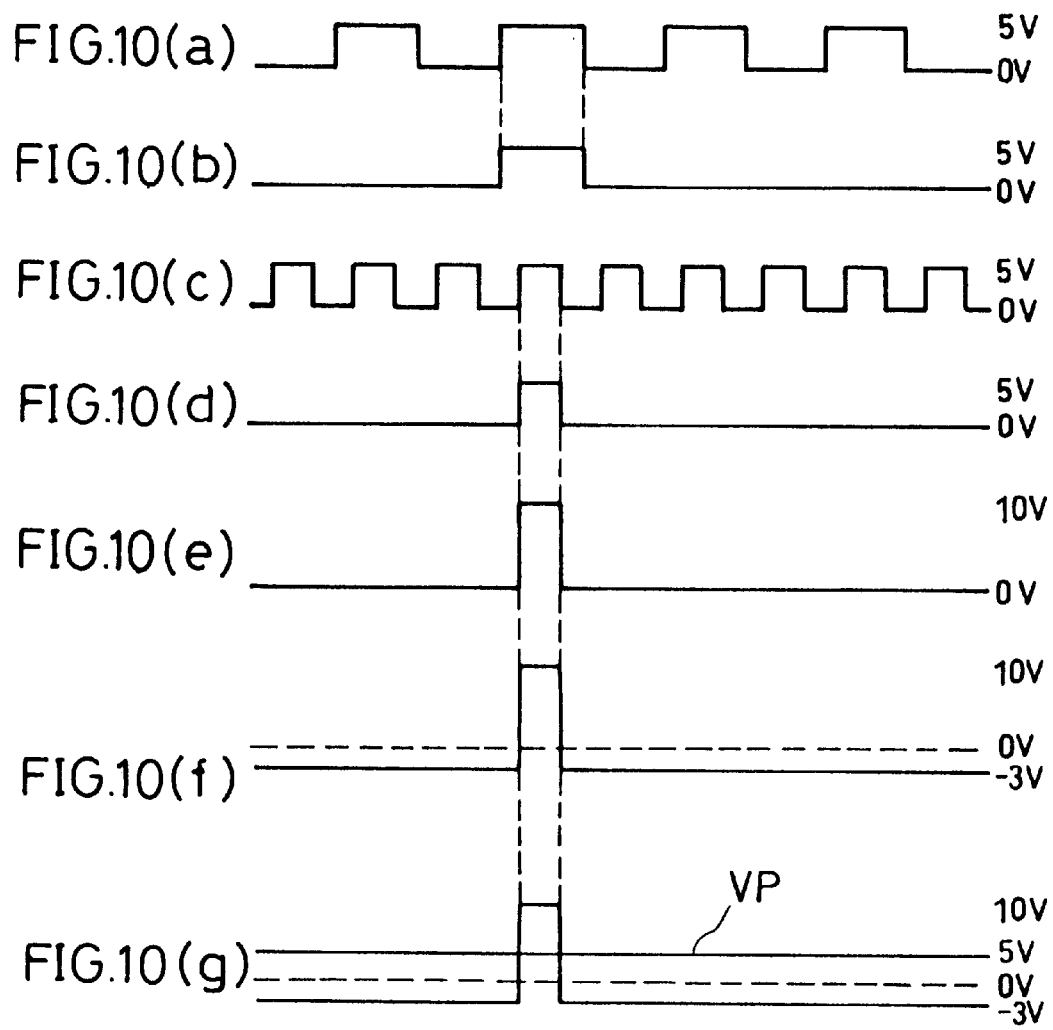

As described, as shown in FIG. 9, the pixel PIX of the liquid crystal display device 11 is arranged such that the other terminal of the auxiliary capacitor CS is connected to the scanning signal line $GL_{j-1}$. Therefore, the pixel PIX has the CS-on-Gate structure which enables a reduction in the sinuous wiring of the common electrode, so that a high numerical aperture can be obtained. According to the liquid crystal display device 11, the pixel PIX may be A.C. driven at a voltage level at which the electric field effect transistor SW is set OFF, thereby achieving a high quality display.

The liquid crystal display device 11 includes the pixel array ARY and the signal line driving circuits GD and SD which are monolithically formed, thereby permitting the pixel and the signal driving circuits GD and SD to be formed in the same process, thereby manufacturing a liquid crystal display device at low cost.

Additionally, the present invention is not limited to the liquid crystal display devices 1 and 11 and can be suitably applied to the following matrix-type display device. That is a display device wherein the pixel PIX is formed in a region in a matrix segmented by the scanning signal lines $GL_j$ and the data signal lines $SL_i$, and the switching element is formed within the pixel PIX.

The described respective driving signal levels and driving voltages merely show examples, and should be suitably adjusted according to the element structure and the amplitude level of the image data DAT.

According to the arrangement of the described first and second embodiments, the level shifters $LS1_j$ and $LS2_j$ are provided wherein the scanning signal line driving circuits GD are the first and second level shifters, and the data signal line driving circuit SD is the third level shifter $LS3_i$. However, the present invention is not limited to the above arrangement, and may be arranged such that the data signal line driving circuit SD includes the first and second level shifters LS1 and LS2 and the scanning signal line driving circuit GD has the third level shifter LS3. Namely, it may be arranged such that the data signal line driving circuit SD includes the level shifters $LS1_i$ and $LS2_i$ in replace of the third level shifter $LS3_i$, and the scanning signal line driving circuit GD includes the level shifter $LS3_j$ in replace of the level shifters $LS1_j$ and $LS2_j$. Alternately, the data signal line driving circuit SD may include the level shifters $LS1_i$ and $LS2_i$ in replace of $LS3_i$, and the signal line driving circuits GD and SD respectively include the first and second level shifters LS1 and LS2. However, in the case where the data signal line driving circuit SD includes the first and second level shifters $LS1_i$ and $LS2_i$ like the described arrangement, a difference in driving signal level between the data signal line driving circuit SD and the scanning signal line driving circuit GD should be taken into consideration. Namely, in order to obtain an optimal driving signal level for driving the data signal line, it is required to adjust the respective shift amounts of the signal level by the first and second level shifters $LS1_i$ and $LS2_i$. Similarly, in the case where the scanning signal line driving circuit GD includes the third level shifter $LS3_j$, it is required to adjust an amount of shift of the signal level by the third level shifter $LS3_j$ in order to obtain an appropriate driving signal level for driving the scanning signal line.

The matrix-type image display device of the present invention may be arranged such that the scanning signal line driving circuit GD includes the first and second level shifter $LS1_j$ and $LS2_j$ and shifts respective voltage levels on high potential side and low potential side, and the data signal line driving circuit SD includes the third level shifter $LS3_i$ for shifting either a voltage level on the high potential side or low potential side of the input signal level. The above arrangement also can be suitably applied to the described liquid crystal display devices 1 and 11.

The invention being thus described, it will be obvious that the same may be varied in many ways. Such variations are not to be regarded as a departure from the spirit and scope of the invention, and all such modification as would be obvious to one skilled in the art are intended to be included within the scope of the following claims.

What is claimed is:

1. A matrix-type image display device, comprising:
   a substrate in which pixels having a switching element are formed in a matrix form in a region segmented by scanning signal lines and data signal lines;
   a scanning signal line driving circuit for driving said scanning signal lines;
   a data signal line driving circuit for driving said data signal lines;
   a first level shift circuit for shifting a voltage level of a voltage on a high potential side of a signal line to be driven; and
   a second level shift circuit for shifting a voltage level of a voltage on a low potential side of the signal line to be driven,
   said first and second level shift circuits being provided in at least one of said scanning signal line driving circuit and said data signal line driving circuit, and
   said first and second level shift circuits being connected in series.

2. The matrix-type image display device as set forth in claim 1, wherein:
   said first and second level shift circuits are formed in said scanning signal line driving circuit, and
   said data signal line driving circuit has a third level shift circuit for shifting a voltage level of at least a high potential side or a low potential side of said data signal line driving circuit.

3. The matrix-type image display device as set forth in claim 2, wherein:
   said first level shift circuit includes first and second transistors wherein a source has a low potential in a same level as a driving voltage to be output from a circuit in a pre-stage of said first and second level shift circuits, and third and fourth transistors wherein a source is at a high potential as desired,
   a drain of said first transistor is connected to a drain of said third transistor and a gate of said fourth transistor, and a drain of said second transistor is connected to a gate of said third transistor and a drain of said fourth transistor,
   said second level shift circuit has fifth and sixth transistors wherein a source has a high potential as desired, and seventh and eighth transistors wherein a source has a low potential as desired;

a drain of said fifth transistor is connected to a drain of said seventh transistor and a gate of said eighth transistor, and a drain of said sixth transistor is connected to a gate of said seventh transistor and a drain of said eighth transistor, a drain of said first transistor is connected to a gate of said fifth transistor, and a drain of said second transistor is connected to a gate of said sixth transistor, and driving signals having mutually opposite phases are input to respective gates of said first and second transistors.

4. The matrix-type image display device as set forth in claim 1, wherein:

respective driving signal levels for said scanning signal line driving circuit and said data signal line driving circuit are different, and respective input signal levels of said scanning signal line driving circuit and said data signal line driving circuit are mutually equivalent.

5. The matrix-type image display device as set forth in claim 1, wherein:

a transistor for use in said first and second level shift circuits has a plurality of channels connected in series.

6. The matrix-type image display device as set forth in claim 1, wherein:

a transistor for use in at least said scanning signal line driving circuit or said data signal line driving circuit is monolithically formed on a polycrystalline silicon thin film with a transistor for use in one of the pixel.

7. The matrix-type image display device as set forth in claim 1, wherein:

each pixel includes a switching element and a pixel capacitor, said pixel capacitor being composed of a liquid crystal capacitor and an auxiliary capacitor, and upon selecting said pixel based on a scanning signal, said switching element takes in image data to be applied to one electrode of said liquid crystal capacitor and to one electrode of said auxiliary capacitor, so that a voltage can be applied to a display medium formed between the one electrode and a counter electrode of said liquid crystal capacitor, to display an image, and the other electrode of said auxiliary capacitor is connected to an adjoining scanning signal line, said counter electrode is A.C. driven at a predetermined frequency based on a voltage level, and said scanning signal line driving circuit includes said first and second level shift circuits, and an amount of shift of a voltage of any one of said level shift circuits varies at the period.

8. The matrix-type image display device as set forth in claim 1, wherein said first level shift circuit shifts a voltage level of a voltage on a high potential side by a first amount and said second level shift circuit shifts a voltage level of a voltage on a low potential side by a second amount different than the first amount.

9. A matrix-type image display device, comprising:

a substrate in which pixels having a switching element are formed in a matrix form in a region segmented by scanning signal lines and data signal lines;

a scanning signal line driving circuit for driving said scanning signal lines;

a data signal line driving circuit for driving said data signal lines;

a first level shift circuit for shifting a voltage level of a voltage on a high potential side of a signal line to be driven; and a second level shift circuit for shifting a voltage level of a voltage on a low potential side of the signal line to be driven, wherein said first and second level shift circuits are provided in at least one of said scanning signal line driving circuit and said data signal line driving circuit, a transistor for use in said first and second level shift circuits has a different element structure from that of a transistor for use in a pre-stage circuit provided on a signal input side of said first and second level shift circuits, and said transistor for use in said first and second level shift circuits has a higher withstanding voltage than that of said transistor for use in said pre-stage circuit.

10. The matrix-type image display device as set forth in claim 9, wherein:

said transistor for use in said first and second level shift circuits has a longer channel than that of said transistor for use in said pre-stage circuit.

11. The matrix-type image display device as set forth in claim 10, wherein:

said transistor for use in said first and second level shift circuits has a channel length of from 1.5 to 3 times of that of said transistor for use in said pre-stage circuit.

12. The matrix-type image display device as set forth in claim 9, wherein:

said transistor for use in said first and second level shift circuits has a gate insulating film which is thicker than the transistor for use in said pre-stage circuit.

13. The matrix-type image display device as set forth in claim 12, wherein:

said transistor for use in said first and second level shift circuits has a gate insulating film which is from 1.25 to 2.5 times thicker than a gate insulating film of said transistor for use in the pre-stage circuit.

14. The matrix-type image display apparatus as set forth in claim 9, wherein:

said transistor for use in said first and second level shift circuits has a region having a low impurity density formed between the channel region and the source region and between the channel region and the drain region.

15. The matrix-type image display apparatus as set forth in claim 14, wherein:

said transistor for use in said first and second level shift circuits has a region of an amount of a dopant per area of from $1 \times 10^{12}$ to $1 \times 10^{14}/cm^2$ between the channel region and the source region and between the channel region and the drain region.

16. The matrix-type image display device as set forth in claim 9, wherein:

said transistor for use in said first and second level shift circuits has a region in which a dopant is not added between a channel region and a source region and between the channel region and a drain region.

17. A matrix-type image display device, comprising:

a scanning signal line driving circuit;

a data signal line driving circuit;

scanning signal lines supplied with scanning signals output by the scanning signal line driving circuit;

data signal lines supplied with image signals output by the data signal line driving circuit;

a row and column array of pixels, each pixel comprising a pixel electrode and a switching element having a first terminal connected to one of the data signal lines, a second terminal connected to the pixel electrode, and a control terminal connected to one of the scanning signal lines; and level-shifting circuitry contained in one of said scanning signal line driving circuit and said data signal line driving circuit, said level-shifting circuitry comprising:

first level shift circuits operable to shift a voltage level of high level signals supplied to inputs thereof by a first amount; and second level shift circuits operable to shift a voltage level of low level signals supplied to inputs thereof by a second amount different than the first amount, wherein each first level shift circuit is connected in series to one of said second level shift circuits.

18. The matrix-type image display device as set forth in claim 17, wherein the other one of said scanning signal line driving circuit and said data signal line driving circuit comprises:

third level shift circuits operable to shift a voltage level of one of the high level signals and the low level signals supplied to inputs thereof.

19. The matrix-type image display device as set forth in claim 18, wherein said first and second level shift circuits comprise part of said scanning signal line driving circuit, and said third level shift circuits comprise part of said data signal line driving circuit.

20. The matrix-type image display device as set forth in claim 17, wherein said first and second level shift circuits comprise part of said scanning signal line driving circuit.

21. A matrix-type image display device, comprising:

a scanning signal line driving circuit;

a data signal line driving circuit;

scanning signal lines supplied with scanning signals output by the scanning signal line driving circuit;

data signal lines supplied with image signals output by the data signal line driving circuit;

a row and column array of pixels, each pixel comprising a pixel electrode and a switching element having a first terminal connected to one of the data signal lines, a second terminal connected to the pixel electrode, and a control terminal connected to one of the scanning signal lines; and level-shifting circuitry contained in one of said scanning signal line driving circuit and said data signal line driving circuit, said level-shifting circuitry comprising:

first level shift circuits operable to shift a voltage level of high level signals supplied to inputs thereof by a first amount; and second level shift circuits operable to shift a voltage level of low level signals supplied to inputs thereof by a second amount different than the first amount, wherein transistors used in said first and second level shift circuits have a higher withstanding voltage than transistors used in a pre-stage circuit provided on a signal input side of said first and second level shift circuits.

* * * * *